United States Patent
Miyazawa et al.

(10) Patent No.: US 9,099,997 B2
(45) Date of Patent: Aug. 4, 2015

(54) LATCH CIRCUIT AND DISPLAY DEVICE

(71) Applicant: Pixtronix, Inc., San Diego, CA (US)

(72) Inventors: Toshio Miyazawa, Chiba (JP); Hajime Akimoto, Kokubunji (JP)

(73) Assignee: Pixtronix, Inc., San Diego, CA (US)

( * ) Notice: Subject to any disclaimer, the term of this patent is extended or adjusted under 35 U.S.C. 154(b) by 281 days.

(21) Appl. No.: 13/651,785

(22) Filed: Oct. 15, 2012

(65) Prior Publication Data

US 2013/0093649 A1    Apr. 18, 2013

(30) Foreign Application Priority Data

Oct. 17, 2011   (JP) .................................. 2011-227851

(51) Int. Cl.
*H03K 3/356* (2006.01)
*G09G 3/34* (2006.01)

(52) U.S. Cl.
CPC ........ *H03K 3/356113* (2013.01); *G09G 3/3433* (2013.01); *G09G 2310/0264* (2013.01); *G09G 2310/08* (2013.01)

(58) Field of Classification Search
CPC ............ H03K 3/356; H03K 3/356113; G09G 2310/0264
USPC .................................. 327/202, 203, 564, 565
See application file for complete search history.

(56) References Cited

U.S. PATENT DOCUMENTS

| | | |
|---|---|---|
| 5,592,411 A | 1/1997 | Tai |
| 6,373,458 B1 | 4/2002 | Yamakura et al. |
| 8,710,887 B2 * | 4/2014 | Osame et al. ................. 327/218 |
| 2003/0123276 A1 | 7/2003 | Yokozeki |
| 2006/0001638 A1 | 1/2006 | Jeon et al. |
| 2006/0250325 A1 | 11/2006 | Hagood et al. |
| 2007/0091014 A1 | 4/2007 | Yamashita et al. |

(Continued)

FOREIGN PATENT DOCUMENTS

| | | |
|---|---|---|
| CN | 1886896 A | 12/2006 |
| JP | 2008-197668 | 8/2008 |

(Continued)

OTHER PUBLICATIONS

European Search Report—EP12188809—Search Authority—Munich—May 8, 2014.

(Continued)

*Primary Examiner* — Hai L Nguyen
(74) *Attorney, Agent, or Firm* — Foley & Lardner LLP; Edward A. Gordon

(57) ABSTRACT

A latch circuit which can control a drain avalanche effect and improve reliability is provided. The latch circuit includes an input transistor importing a voltage corresponding to "0" or "1" when the scanning voltage is input to a gate, a storage capacitance storing a voltage imported by the input transistor, and having a first electrode and a second electrode, the first electrode is input with a capacitance control signal and the second electrode is connected to a second electrode of the input transistor, a first conduction type first transistor having a gate connected to the second electrode of the input transistor, a second electrode connected to a first output terminal, and a first electrode input with a first latch control signal, and a second conduction type second transistor having a gate connected to the second electrode of the first transistor, a second electrode connected to a second output terminal, and a first electrode input with a second latch control signal.

7 Claims, 15 Drawing Sheets

(56) References Cited

U.S. PATENT DOCUMENTS

2007/0211043 A1 9/2007 Furuichi
2008/0174532 A1 7/2008 Lewis

FOREIGN PATENT DOCUMENTS

| JP | 2008-538009 | 10/2008 |
| KR | 20000035164 A | 6/2000 |
| KR | 20060003968 A | 1/2006 |
| KR | 20070092100 A | 9/2007 |
| WO | WO 2006/091738 A1 | 8/2006 |
| WO | 2008120275 A1 | 10/2008 |

OTHER PUBLICATIONS

Partial European Search Report—EP12188809—Search Authority—Munich—Jan. 14, 2014.

* cited by examiner

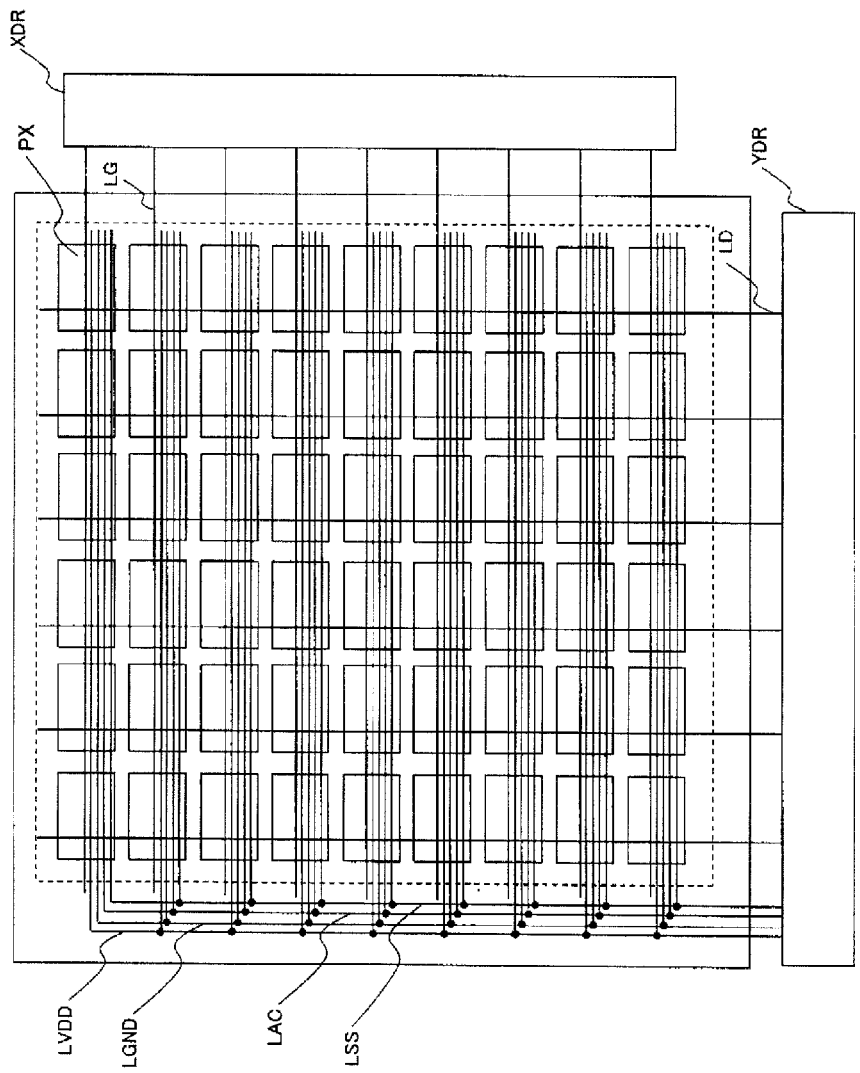

LATCH CIRCUIT AND DISPLAY DEVICE

CROSS-REFERENCE TO RELATED APPLICATIONS

This application is based upon and claims the benefit of priority from the prior Japanese Patent Application No. 2011-227851, filed on 17 Oct. 2011, the entire contents of which are incorporated herein by reference.

FIELD

The present invention is related to a latch circuit and a display device. In particular, the present invention is related to a latch circuit which latches latch data in relatively short time intervals, and a display device which uses the latch circuit.

BACKGROUND

Generally, a latch circuit is formed from a CMOS circuit. For example, as is shown in FIG. 12, a latch circuit which uses an n type MOS transistor (NMT93, NMT94) connected between a power supply line (LVDD) supplied with a VDD voltage and a power supply line (LGND) supplied with a GND voltage, and a p type MOS transistor (PMT95, PMT96) is commonly used.

FIG. 13 shows variance of a scanning pulse (φG) applied to a scanning line (LD) shown in FIG. 12, a latch control signal (φAC1) applied to a latch control line (LAC) and evoltages of each node (N91, N92, N93, N94) in accordance with time elapse.

First, the case where a voltage (data) on a signal line (LD) is a Low level (herein referred to as L level) voltage is explained. Here, before a time t1, the voltage of the node N91 is a High level (herein referred to as H level) voltage VH3, that of the node N92 is an H level voltage VDD, that of the node N93 is an L level voltage GND and that of the node N94 is an L level voltage VH4.

Next, when the latch control signal (φAC1) on the latch control line (LAC) changes from a L level voltage VL to a H level voltage VH2 at a time t2, the n type MOS transistor NMT92 is turned ON and the voltage of the node N94 becomes a voltage VL. In this way, the p type MOS transistor PMT95 and the n type MOS transistor NMT94 are turned ON, the p type MOS transistor PMT96 and the n type MOS transistor NMT93 are turned OFF, the voltage of the node N92 (output terminal (OUT2)) becomes a L level voltage GND, and that of the node N93 (output terminal (OUT1)) becomes a H level voltage VDD.

Next, the case where a voltage (data) on a signal line (LD) is H level voltage VDH is explained. Here, before a time t3, the voltage of the node N91 is an L level voltage VL, that of the node N92 is an L level voltage GND, that of the node N93 is an H level voltage VDD, and that of the node N94 is an L level voltage VL.

As is shown in FIG. 13, when the scanning pulse (φG) on the scanning line (LG) changes from a L level voltage VL to a H level voltage VH1 at a time t3, the n type MOS transistor NMT91 is turned ON, and a voltage (data: here a voltage VDH) on the signal line (LD) is input to a storage capacitance (CD). In this way, the voltage of the node N91 becomes a voltage VH3. Next, when the latch control signal (φAC1) on the latch control line (LAC) changed from a L level voltage VL to a H level voltage VH2 at a time t4, the n type MOS transistor (NMT92) is turned ON and the voltage of the node N94 becomes a voltage VH4. In this way, the n type MOS transistor (NMT93) and the p type MOS transistor (NMT96) are turned ON, the p type MOS transistor (PMT95) and the n type MOS transistor (NMT94) are turned OFF, the voltage of the node (N92) (output terminal (OUT2)) becomes a H level voltage VDD, and the voltage of the node (N93) (output terminal (OUT1)) becomes a L level voltage GND.

As is shown in FIG. 14, a pixel circuit of a display (referred to below as a movable shutter type display) which electrically controls the position of a movable shutter (s) to display an image in accordance with output signals from two output terminals (OUT1, OUT2) of the latch circuit is a specific usage example of the latch circuit shown in FIG. 12. Furthermore, a movable shutter type display is disclosed for example in Patent Document 1 (Japanese Laid Open Patent 2008-197668).

In the pixel circuit of the movable shutter type display shown in FIG. 14, the movable shutter (s) moves at a high speed in the direction of an electric field. As a result, in case the voltage of the node N92 is GND and that of the node N93 is VDD, the movable shutter (s) moves to the node N93. In the case the voltage of the node N92 is VDD and that of the node N93 is GND, the movable shutter (s) moves at a high speed to the node N92. In addition, for example, in the case where the movable shutter moves to the node N92, light from a backlight unit passes through it and a pixel becomes a light emitting state, and in the case where the movable shutter moves to the node N93, light from a backlight unit does not pass through it and a pixel becomes a light non-emitting state. In this way, it is possible to display image as if it were a liquid crystal display panel or a plasma display panel. Furthermore, in FIG. 14, LSS is a movable shutter control line supplied with a shutter control signal (φS).

FIG. 15 is a block diagram which shows an approximate structure of a movable shutter type display. In the movable shutter type display shown in FIG. 15, a plurality of pixel circuits shown in FIG. 14 each corresponding to 1 pixel (PX) are arranged in 2 dimensions. Here, the scanning line (LG) is arranged on each row of which signal is input to a vertical drive circuit (XDR). In addition, a signal line (LD) is arranged on each column of which signal is input to a horizontal drive circuit (YDR). Power supply lines (LVDD, LGND), the latch control line (LAC) and the movable shutter control line (LSS) are commonly arranged on each pixel to input signals to the horizontal drive circuit (YDR). In the movable shutter type display shown in FIG. 15, data is programmed to each pixel on each row within a programming time period (TA in FIG. 13), and within a movable shutter state setting time period (TB in FIG. 13), the movable shutter (s) is made to move to the node N92 or the node N93 and an image is displayed in a display time period (TC in FIG. 13).

As is shown in FIG. 12, a circuit configuration in which a latch circuit is configured of a CMOS circuit is currently widely used and has proven actual results. However, for example, when attempting to apply a latch circuit configured of the CMOS circuit shown in FIG. 12 for high voltage use (for example, for use with a voltage where a potential difference between a voltage VDD and a voltage GND is 20V or more) using a MOS transistor in which polycrystalline silicon (polysilicon) is used for a semiconductor layer, it is assumed that the characteristics of a thin film transistor deteriorate due to a drain avalanche effect and doubts concerning reliability arise.

The present invention was performed in order to solve these conventional technological problems. The aim of the present invention is to provide a latch circuit which is capable of controlling a drain avalanche effect and improving reliability, and a display device which uses this latch circuit. The aim of the present invention and other aims and new characteristics are made clear with reference to the descriptions of the present specification and attached drawings.

SUMMARY

A summary of a representative invention among the inventions disclosed in the present application is simply explained as follows (1)

The first aspect of the present invention is a latch circuit for holding and latching data when a scanning voltage is input. The circuit comprises an input transistor having first and second electrodes and a gate, the first electrode being applied with a voltage corresponding to "0" or "1", the input transistor outputting the voltage from the second electrode when the scanning voltage is input to the gate, a retention capacitance retaining a voltage output by the input transistor, and having a first electrode and a second electrode, the second electrode being applied with a capacitance control signal and the first electrode being connected to a second electrode of the input transistor, a first transistor which is one of n type and p type transistors having a gate connected to the second electrode of the input transistor, a first electrode applied with a first latch control signal and a second electrode connected to a first output terminal and a second transistor which is the other of n type and p type transistors having a gate connected to the second electrode of the first transistor, a first electrode input with a second latch control signal and a second electrode connected to a second output terminal. In the circuit, voltage levels of the capacitance control signal and the first latch control signal and the second latch control signal are respectively changed at a certain timing, so that a voltage of the first output terminal and a voltage of the second output terminal are changed to a voltage corresponding to "0" or "1" and latched.

In the first aspect of the present invention, on an assumption that time elapses in a sequence from a time t1 to a time t6, the voltage of the second latch control signal may be a second voltage level in a time period up to a time t1 after a voltage corresponding to "0" data or "1" data is retained in the retention capacitance, changed to a first voltage level from the second voltage level at the time t1, and changed to the second voltage level from the first voltage level at a time t7, the voltage of the capacitance control signal may be the second voltage level in a time period up to a time t2, changed to the second voltage level from the first voltage level at the time t2, and changed to the first voltage level from the second voltage level at a time t4 and the voltage of the first latch control signal may be an intermediate voltage level between the first voltage level and the second voltage level in a time period up to a time t3, changed to the second voltage level from the intermediate voltage level at the time t3, changed to the first voltage level from the second voltage level at a time t5, and changed to the intermediate voltage level from the first voltage level at a time t6.

In this way, the first transistor is turned OFF before the time t3, turned ON at the time t3, turned OFF at the time t4, turned ON or OFF in accordance with a voltage stored in the storage capacitance at the time t5, and turned OFF after t6, the second transistor is turned ON at the time t4 by the first transistor being turned ON at the time t3m, turned OFF at the time t4, and turned ON when the first transistor is turned ON at the time t5, or turned OFF when the first transistor is turned OFF at the time t5.

Therefore, because the first transistor is turned ON at the time t3, the voltage of the first output terminal is changed to the intermediate voltage level at the time t3, and then changed to the second voltage level at the time t4, is maintained at the first voltage level after being changed to the first voltage level in the case where the first transistor is turned ON at the time t5. On the contrary, because the second transistor is turned ON at the time t3, the voltage of the second output terminal is changed to the first voltage level, maintained at a voltage of a second voltage level after being changed to the second voltage level at a time t7 in the case where the first transistor is turned ON at a time t5, or maintained at the first voltage level in the case where the first transistor is turned ON at a time t5.

(2)

The second aspect of the present invention is a latch circuit for holding and latching data when a scanning voltage is input. The circuit comprises an input transistor having first and second electrodes and a gate, the first electrode being applied with a voltage corresponding to "0" or "1", the input transistor outputting the voltage from the second electrode when the scanning voltage is input to the gate, a retention capacitance retaining a voltage output by the input transistor, and having a first electrode and a second electrode, the second electrode being applied with a fixed voltage and the first electrode being connected to a second electrode of the input transistor, a first transistor which is one of n type and p type transistors having a gate connected to the second electrode of the input transistor, a first electrode applied with a first latch control signal and a second electrode connected to a first output terminal, a second transistor which is the other of n type and p type transistors having a gate connected to the second electrode of the first transistor, a first electrode input with a second latch control signal and a second electrode connected to a second output terminal and a diode connected between a first electrode and a second electrode of the first transistor and becomes a conducting state corresponding to a change in a voltage level of the first latch control signal. In the circuit, voltage levels of the first latch control signal and the second latch control signal are respectively changed at a certain timing, so that a voltage of the first output terminal and a voltage of the second output terminal are changed to a voltage corresponding to "0" or "1" and latched.

In the second invention of the present invention, on an assumption that time elapses in a sequence from a time t1 to a time t6, the voltage of the second latch control signal may be a second voltage level in a time period up to a time t1 after a voltage corresponding to "0" data or "1" data is retained in the retention capacitance, changed to a first voltage level from the second voltage level at the time t1, and changed to the second voltage level from the first voltage level at the time t5, and the voltage of the first latch control signal may be an intermediate voltage level between the first voltage level and the second voltage level in a time period up to the time t2, changed to the second voltage level from the intermediate voltage level at the time t2, changed to the first voltage level from the second voltage level at the time t3, and changed to the intermediate voltage level from the first voltage level at the time t4.

In this way, the diode is turned OFF before the time t2, and turned OFF at the time t3 after becoming a conducting state at the time t2, the first transistor is turned OFF before the time t3, turned ON at the time t3, turned ON or OFF in accordance with a voltage stored in the storage capacitance at the time t3, and turned OFF at a time t4, the second transistor is turned ON in the case where the voltage of the first output terminal is a first voltage level at the time t1, or turned OFF in the case where the voltage of the first output terminal is the second voltage level at the time t1, and turned ON when the first transistor is turned ON at the time t3, or turned OFF when the first transistor is turned OFF at the time t3.

Therefore, because the diode is conducting at the time t2, the voltage of the first output terminal is changed to the second voltage level, maintained at the first voltage level after being changed to the first voltage level in the case where the first transistor is turned ON at the time t3, or maintained at the second voltage level in the case where the first transistor is turned OFF at the time t3, a voltage of the second output terminal is changed to the first voltage level in the case where the second transistor is turned ON at the time t1, or maintained at the first voltage level in the case where the second transistor is turned OFF at the time t1, and maintained at the second voltage level after being changed to the second voltage level at the time t5 in the case where the first transistor is turned ON at the time t3, or maintained at the first voltage level in the case where the first transistor is turned OFF at the time t5.

In addition, the present invention is a display device arranged with a plurality of pixels, each having a movable shutter, in which the device electrically controls the position of the movable shutter to display an image, in which each pixel includes a pixel circuit which electrically controls the position of the movable shutter, and in which the pixel circuit includes the aforementioned latch circuit.

(3)

The third aspect of the present invention is a latch circuit for holding and latching data when a scanning voltage is input. The circuit comprises an input transistor having first and second electrodes and a gate, the first electrode being applied with a voltage corresponding to "0" or "1", the input transistor outputting the voltage from the second electrode when the scanning voltage is input to the gate, a retention capacitance retaining a voltage output by the input transistor, and having a first electrode and a second electrode, the second electrode being applied with a fixed voltage and the first electrode being connected to a second electrode of the input transistor, a first transistor which is one of n type and p type transistors having a gate connected to the second electrode of the input transistor, a first electrode and a second electrode connected to a first output terminal, a second transistor which is the other of n type and p type transistors having a gate connected to the second electrode of the first transistor, a first electrode input with a second latch control signal and a second electrode connected to a second output terminal, a fourth transistor as same type as the first transistor having a gate input with a third latch control signal, a first electrode input with the first latch control signal and a second electrode connected to the first electrode of the first transistor and a diode connected between the second electrode of the first transistor and the first electrode of the fourth transistor, the diode becoming a conducting state corresponding to a change in a voltage level of the first latch control signal. In the circuit, the voltage levels of the first latch control signal, the second latch control signal and the third latch control signal are respectively changed at a certain timing, so that a voltage of the first output terminal and a voltage of the second output terminal are changed to a voltage corresponding to "0" or "1" and latched.

In the third aspect of the present invention, on an assumption that time elapses in a sequence from a time t1 to a time t6, the voltage of the second latch control signal may be a second voltage level in a time period up to a time t1 after a voltage corresponding to "0" data or "1" data is retained in the retention capacitance, is changed to a first voltage level from the second voltage level at the time t1, and changed to the second voltage level from the first voltage level at time t5, the voltage of the first latch control signal may be the first voltage level in a time period up to a time t3, changed to the second voltage level from the first voltage level at the time t3, and changed to the first voltage level from the second voltage level at a time t4, and the voltage of the third latch control signal may be the first voltage level in a time period up to a time t2, changed to the second voltage level from the first voltage level at the time t2, and changed to the first voltage level from the second voltage level at the time t4.

The diode may be turned OFF before the time t3, turned OFF at the time t4 after becoming the conducting state at the time t3, the first transistor is turned OFF after the time t3 and before the time t4, turned ON or OFF in accordance with a voltage stored in storage capacitance before the time t3 and after the time t4, the second transistor may be turned ON in the case where a voltage of the first output terminal is a first voltage level before a time t1, or turned OFF in the case where a voltage of the first output terminal is the second voltage level at the time t1, and turned ON when the first transistor is turned ON at the time t4, or turned OFF when the first transistor is turned OFF at the time t4, the voltage of the first output terminal is changed to the second voltage level with the diode conducting at a time t3, and maintained at the first voltage level after being changed to the first voltage level in the case where the first transistor is turned ON at a time t4, or maintained at the second voltage level in the case where the first transistor is turned OFF at the time t3, a voltage of the second output terminal may become the first voltage level in the case where the second transistor at the time t1, or maintained the second voltage level in the case where the second transistor is turned OFF at the time t1, and maintained at the second voltage level after being changed to the second voltage level at the time t5 in the case where the first transistor is turned ON at the time t3, or maintained at the first voltage level or the voltage of the second output terminal before the time t1 in the case where the first transistor is turned OFF at the time t5.

BRIEF DESCRIPTION OF THE DRAWINGS

FIG. 15 is a block diagram which shows an approximate structure of a display which electrically controls the position of a movable shutter (s) to display an image.

DESCRIPTION OF EMBODIMENTS

Figure 1:
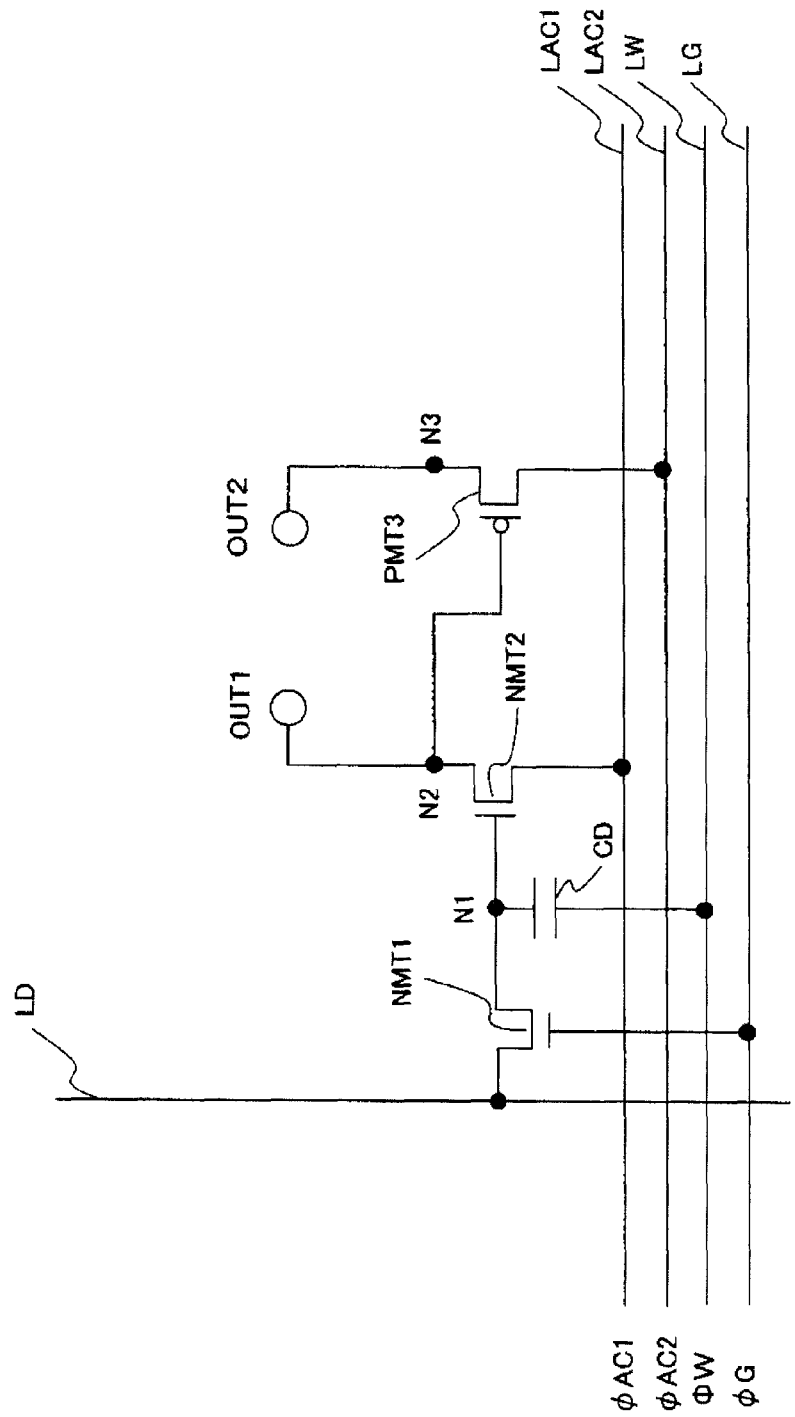
FIG. 1 is a circuit diagram which shows a latch circuit according to the first embodiment of the present invention.

The embodiments of the present invention are explained below while referring to the diagrams. Furthermore, in all the diagrams for explaining the embodiments the same symbols are provided to those components having the same functions and repeated explanations are omitted. In addition, the embodiments below are not intended to restrict an interpretation of the scope of the patent claims of the present invention First Embodiment FIG. 1 is a circuit diagram which shows a circuit structure of a latch circuit according to the first embodiment of the present invention. The latch circuit of the present embodiment is configured of two n type MOS transistors (NMT1, NMT2), one p type MOS transistor PMT3, and one storage capacitance (CD). Furthermore, the n type MOS transistors (NMT1, NMt2) and the p type MOS transistor PMT3 have semiconductor layers formed from polycrystalline silicon. In addition, in FIG. 1, LD is a signal line, LG is a scanning line, LW is a capacitance control line supplied with a capacitance control signal (φW), LAC1 is a first latch control signal supplied with a first latch control signal (φAC1), and LAC2 is a second latch control line supplied with a second latch control signal (φAV2). The n type MOS transistor NMT1 is an input transistor for reading a signal supplied from the signal line (LD) to the storage capacitance (CD) by the scanning pulse (φG). In addition, the n type MOS transistor NMT2 and the p type MOS transistor PMT3 are a pair of transistors for producing a latch function.

Figure 2:
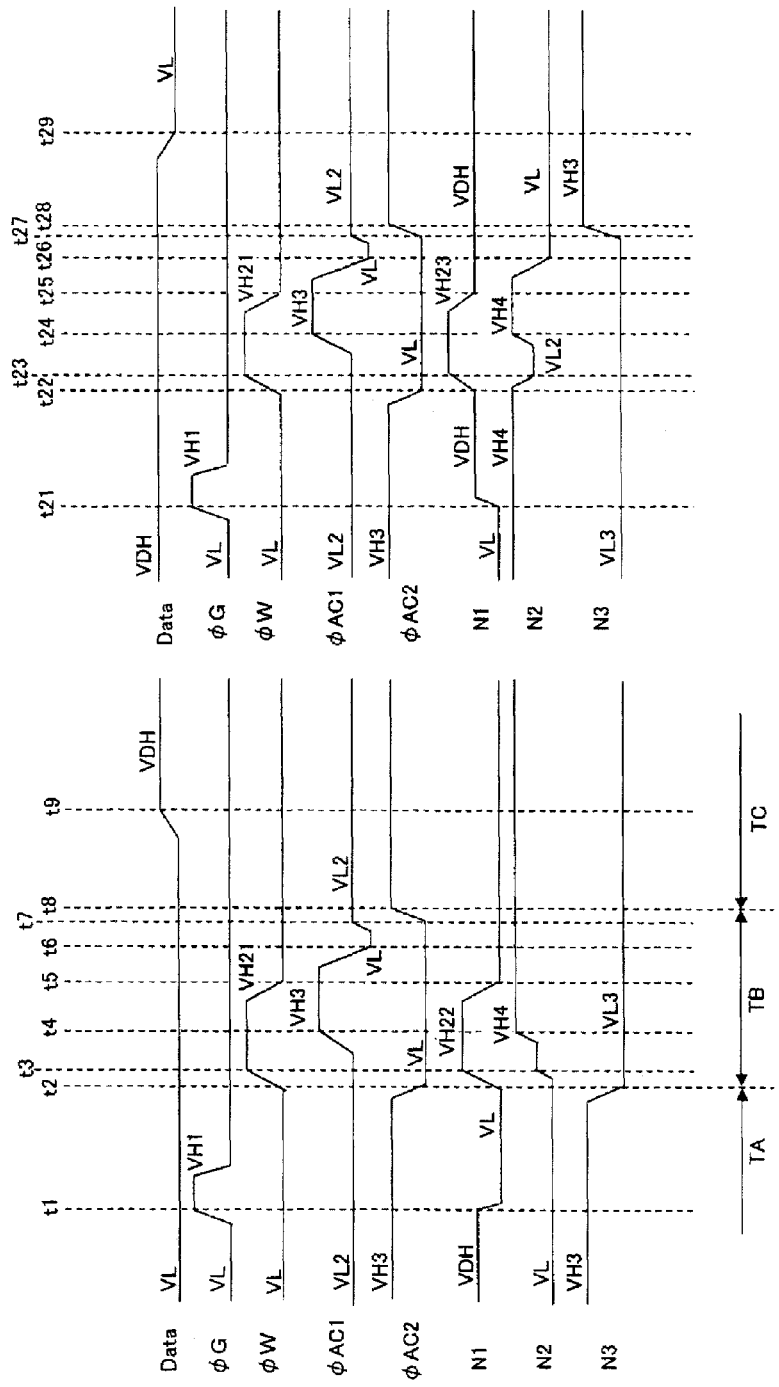
FIG. 2 is a timing chart which shows a scanning pulse (φG), a capacitance control signal (φW), a latch control signal (φAC1, φAC2) and a change over time of each node (N1, N2, N3) of the latch circuit shown in FIG. 1.

FIG. 2 is a timing chart which shows variation in accordance with time elapse of a scanning pulse (φG), a capacitance control signal (φW), a latch control signal (φAC1, φAC2) and voltage of each node (N1, N2, N3). First, the case where a voltage (data) on the signal line (LD) is a Low level (herein referred to as L level) voltage is explained. Here, before a time t1, the voltage of the node N1 is a High level (herein referred to as H level) voltage VDH, that of the node N2 is an L level voltage VL and that of the node N3 is an H level voltage VH3.

As is shown in FIG. 2, when a scanning pulse (φG) (that is, a signal reading pulse (gate pulse)) on a scanning line (LG) is changed from a L level voltage VL to a H level voltage VH1 (in other words, when a selection scanning voltage is input), the n type MOS transistor (input transistor NMT1) is turned ON and the voltage of the node N1 becomes a voltage (data, here, a voltage VL) on the signal line (LD). At this time, the voltage of the first latch control signal (φAC1) on the first latch control line (LAC1) becomes a voltage VL2 which is an intermediate voltage level, VL2 is set so that the formula (1) below is satisfied, and the n MOS transistor NMT2 is maintained in an OFF state regardless of whether the voltage of the node N1 is a H level voltage VDH or a L level voltage VL.

$$VL2 \geq VHD + Vth \text{ (Vth is a threshold voltage of the transistor (NMT2))} \quad (1)$$

Furthermore, for the purposes of simplification, the threshold voltage of all the n type MOS transistors is given as Vth, and the threshold voltage of all the p type MOS transistors is given −Vth.

A second latch control signal (φAC2) on a second latch control line (LAC2) changes from an H level voltage VH3 to an L level voltage VL at a time t2. Here, whether the p type MOS transistor PMT3 is ON or OFF is determined by the voltage of the node N2. However, because the voltage of the node N2 is an L level voltage VL at a time t2, the p type MOS transistor PMT3 is in an ON state and the voltage of the node N3 and the second latch control signal (φAC2) become an L level voltage VL3. Here, VL3 follows the following formula:

$$VL3 = VL - (-Vth) = VL + Vth$$

A capacitance control voltage (φW) on a capacitance control line (LW) changes from an L level voltage VL to an H level voltage VH21 at a time t3. Because the node N1 which is in a floating state is linked with the capacitance control line (LW9 via the storage capacitance (CD), the voltage of the N1 rises to a voltage VH22 together with the voltage of the capacitance control signal (φW). The voltage VH22 of the node N1 generally becomes a voltage shown in the following formula:

$$VH22 \simeq VL + (VH21 - VL) \times CD/(CD + CS) \quad (2)$$

Here, CS is a capacitance other than a storage capacitance (CD) in the node N1.

Because the n type MOS transistor NMT2 becomes an ON state due to the voltage VH22 and the node N2 is connected to the first latch control line (LAC1), the voltage of the node N2 becomes an intermediate voltage level voltage VL2. At this time, the p type MOS transistor PMT3 also becomes an ON state. However, because the voltage of the node N3 is already an L level voltage VL3, the voltage of the node N3 does not change.

The first latch control signal (φAC1) on the first latch control line (LAC1) changes from an intermediate voltage level voltage VL2 to an H level voltage VH3 at a time t4. Because the n type MOS transistor NMT2 is in an ON state, the voltage of the node N2 rises to an H level voltage VH4 with a rise in the voltage of the first latch control signal (φAC1). As a result the p type MOS transistor PMT3 is turned ON. Here, VH4 is generally a voltage shown in the following formula:

$$VH4 \simeq VH22 - Vth$$

However, if VH22−Vth≥VH3, then VH4=VH3.

When the capacitance control signal (φW) changes from an H level voltage VH21 to an L level voltage VL at a time T5, because the node N1 generally returns to a voltage VL, the n type MOS transistor NMT1 is turned OFF. The first control latch signal (φAC1) on the first latch control line (LAC1) changes from an H level voltage VH3 to an L level voltage VL at a time t6. However, because the n type MOS transistor NMT2 is maintained in an OFF state, the node N2 is maintained at an H level voltage VH4. The first control latch signal (φAC1) on the first latch control line (LAC1) changes from an L level voltage VL to an intermediate voltage level voltage VL2 at a time t7. In this way, the n type MOS transistor NMT2 is maintained in an OFF state regardless of a programming voltage (VDH, VL) from the signal line (LD) to the node N1.

The second control latch signal (φAC2) on the second latch control line (LAC2) changes from an L level voltage VL to an H level voltage VH at a time t8. Because a gate voltage of the p type MOS transistor PMT3 is a voltage of the node N2 and the voltage of the node N2 is an H level voltage VH4 at a time t8, the p type MOS transistor PMT3 is in an OFF state. Therefore, the node N3 is maintained at an L level voltage VL3. By following the procedure described above, a voltage of an output terminal (OUT1) becomes a H level voltage (=a voltage of the node N2) and a voltage of an output terminal (OUT2) becomes a L level voltage (=a voltage of the node N3) according to a signal voltage (a voltage corresponding to "0" data) programmed at a time t1, so that a differential output state between the output terminal (OUT1) and the output terminal (OUT2) is latched.

Next, the case where a voltage (data) on a signal line (LD) is an H level voltage VDH is explained. Here, before a time t2, the voltage of the node N1 is an L level voltage VL, that of the node N2 is an H level voltage VH4 and that of the node N3 is an L level voltage VL3.

As is shown in FIG. 2, when a scanning pulse (φG) (that is, a signal reading pulse (gate pulse)) on a scanning line (LG) is changed from a L level voltage VL to a H level voltage VH1 (in other words, when a selection scanning voltage is input), the input transistor (NMT1) is turned ON and the voltage of the node N1 becomes a voltage (data, here, a voltage VDH) on the signal line (LD). At this time, the voltage of the first latch control signal (φAC1) on the first latch control line (LAC1) becomes a voltage VL2 which is an intermediate voltage level, and as described above, the n type MOS transistor NMT2 is maintained in an OFF state regardless of whether the voltage of the node N1 is a H level voltage VDH or a L level voltage VL, so that there is no variation in the output (latch state).

The second latch control signal (φAC2) on the second latch control line (LAC2) becomes an L level voltage VL at a time t22. However, because the p type MOS transistor PMT3 is in an OFF state and the voltage of the output terminal (OUT1) is an L level voltage VL3 before a time t22, there is no change in the voltage of the output terminal (OUT2).

The capacitance control signal (φW) on the capacitance control line (LW) changes from an L level voltage VL to an H level voltage VH21 at a time t23. Because the node N1 which is in a floating state is linked with the capacitance control line (LD) via the storage capacitance (CD), the voltage of the node N1 also rises with a rise in a voltage of the capacitance control signal (φW). At this time, the voltage VH23 of the node N1 generally becomes a voltage shown in the following formula (3):

$$VH23 = VDH + (VH21 - VDH) \times CD/(CD + CS) \quad (3)$$

Because the n type MOS transistor NMT2 becomes an ON state due to the voltage VH23 and the node N2 is connected to the first latch control line (LAC1), the node N2 becomes an intermediate voltage level voltage VL2. At this time, the p type MOS transistor PMT3 becomes an ON state. However, because the voltage of the node N3 is in already at an L level voltage VL3, the voltage of the node N3 does not change. The first latch control signal (φAC1) of the first latch control line (LAC1) changes from an intermediate level voltage VL2 to an H level voltage VH3 at a time t24. Because the n type MOS transistor NMT2 is in an ON state, the voltage of the node N2 rises to an H level voltage VH4 together with a rise in the voltage of the first latch control signal (φAC1). As a result, the p type MOS transistor PMT3 becomes an OFF state.

Because the node N1 generally returns to a voltage VDH when the capacitance control signal (φW) changes from an H level voltage VH21 to an L level voltage VL at a time t25, the n MOS transistor NMT2 becomes an OFF state. When the first latch control signal (φAC1) on the first latch control line (LAC1) becomes a L level voltage VL at a time t26, the n type MOS transistor NMT2 becomes an ON state and the voltage of the node N2 becomes a L level voltage VL. Together with this, the p type MOS transistor PMT3 becomes an ON state. The first latch control signal (φAC1) on the first latch control line (LAC1) changes from an L level voltage VL to an intermediate voltage level voltage VL2 at a time t27. In this way, the n type MOS transistor NMT2 is maintained in an OFF state regardless of a programming voltage (VDH, VL) from the signal line (LD) to the node N1.

In addition, because a gate voltage of the p type MOS transistor PMT3 is a voltage of the node N2 and the voltage of the node N2 is a L level voltage VL at a time t27, the p type MOS transistor PMT3 is maintained in an ON state. The second latch control signal (φAC2) on the second latch control line (LAC2) changes from an L level voltage VL to an H level voltage VH3 at a time t28. At this time, because the p type MOS transistor PMT3 is in an ON state, the voltage of the node N3 rises to an H level voltage VH together with a rise in the second latch control signal (φAC2).

By following the procedure described above, a voltage of an output terminal (OUT1) becomes a L level voltage (=a voltage of the node N2) and a voltage of an output terminal (OUT2) becomes a H level voltage (=a voltage of the node N3) according to a signal voltage (a voltage corresponding to "1" data) programmed at a time t21, so that a differential output state between the output terminal (OUT1) and the output terminal (OUT2) is latched.

The following effects can be obtained from the latch circuit of the present embodiment.
(1) In all transistor operations, it is possible to avoid conditions where drain avalanche can easily occur and to improve reliability when using a high voltage, because a drain voltage becomes a H level voltage (a L level voltage at an absolute value in the case of a p MOS transistor) after a MOS transistor becomes an ON state with a gate voltage applied.
(2) The number of transistors contained in the latch circuit o the present invention is smaller than that configured of a CMOS circuit, which are useful for high definition.

Figure 3:
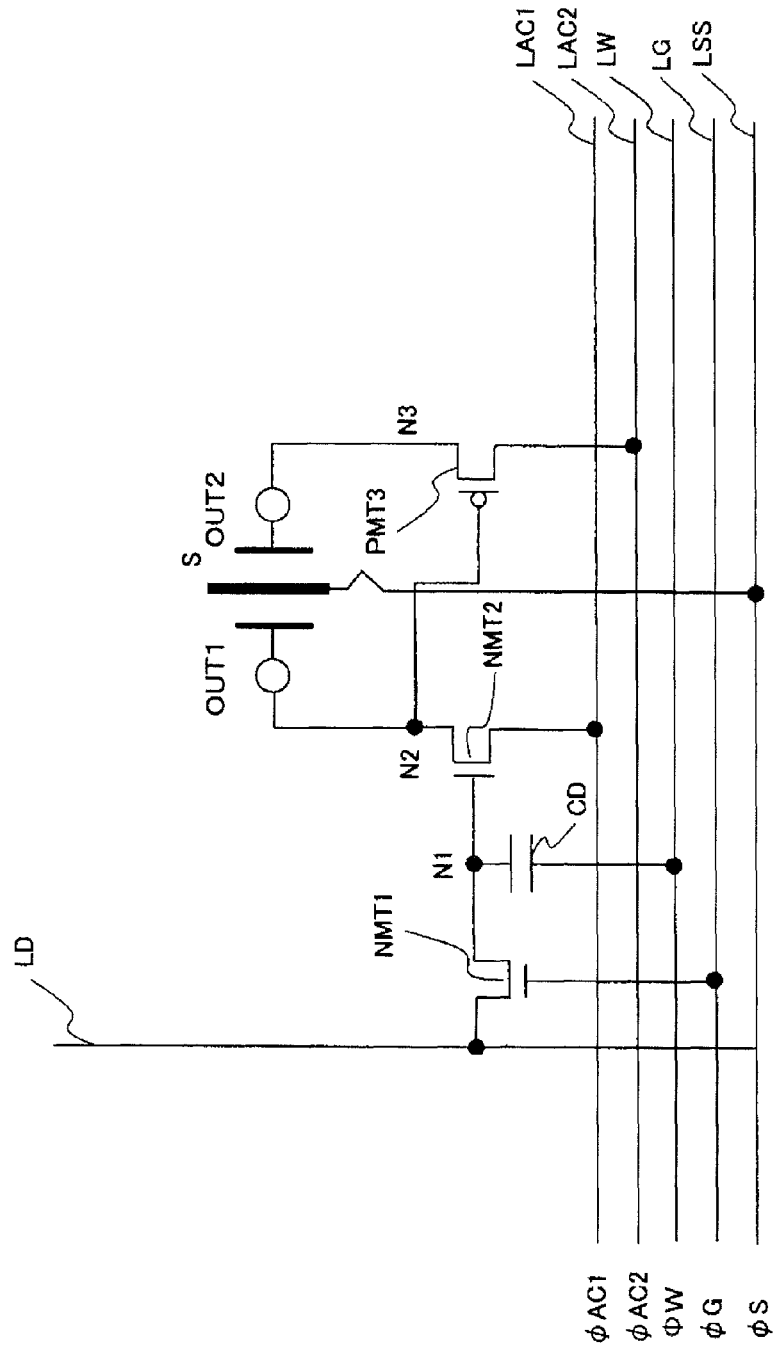
FIG. 3 is a circuit diagram which shows a circuit structure of a pixel circuit of a display which electrically controls the position of a movable shutter to display an image, applied with a latch circuit according to the first embodiment of the present invention.
Figure 4:
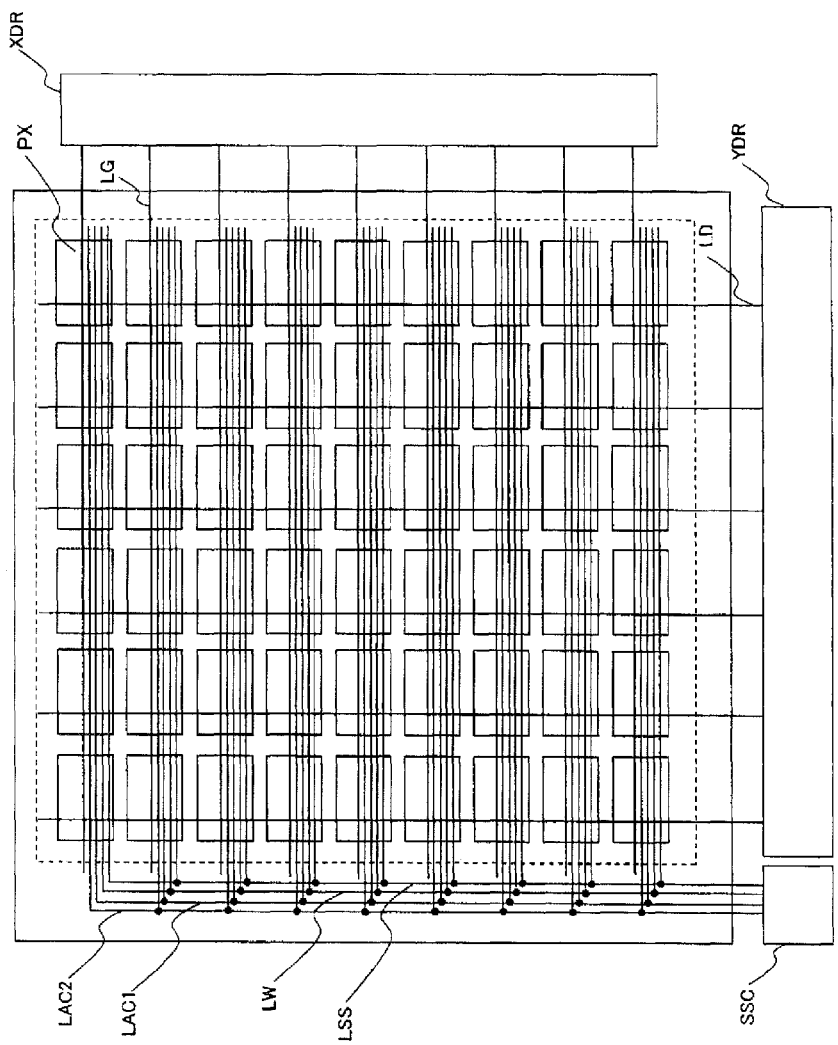
FIG. 4 is a block diagram which shows an approximate structure of a display applied with a latch circuit and which electrically controls the position of a movable shutter to display an image according to the first embodiment of the present invention.
Figure 11:
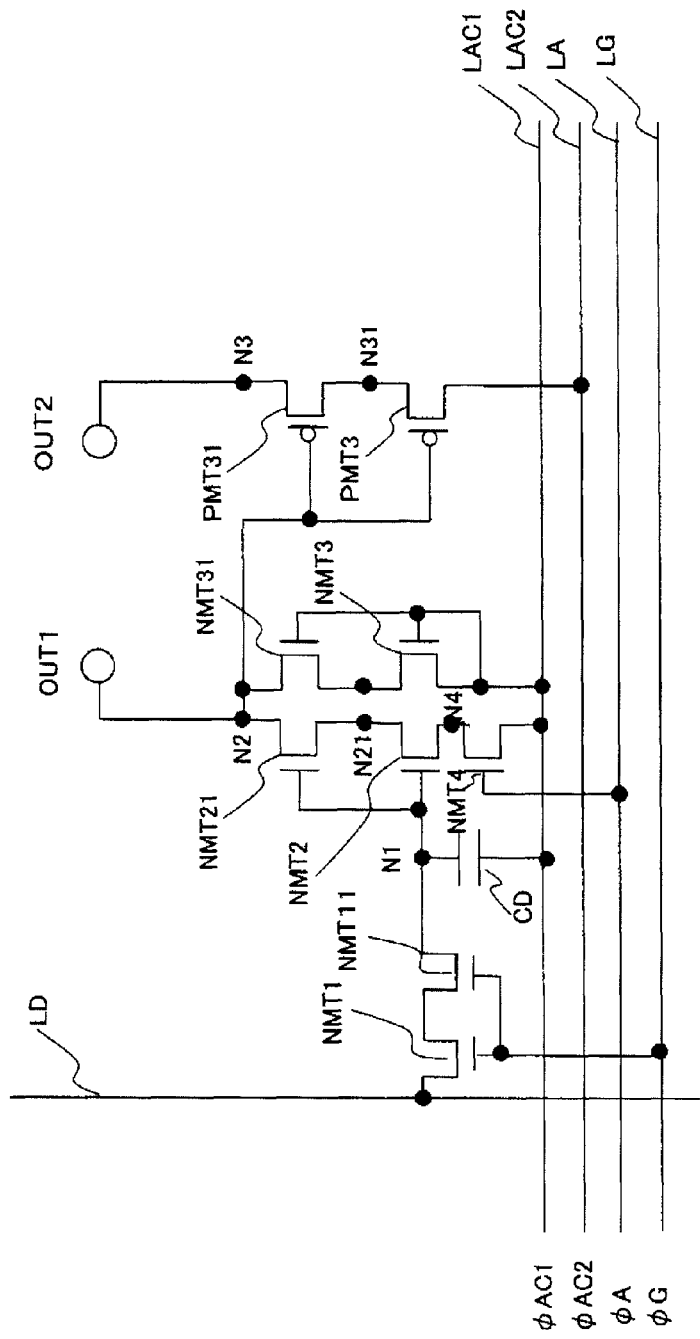
FIG. 11 is a diagram which shows a circuit structure of a latch circuit according to a sixth embodiment of the present invention.
Figure 12:
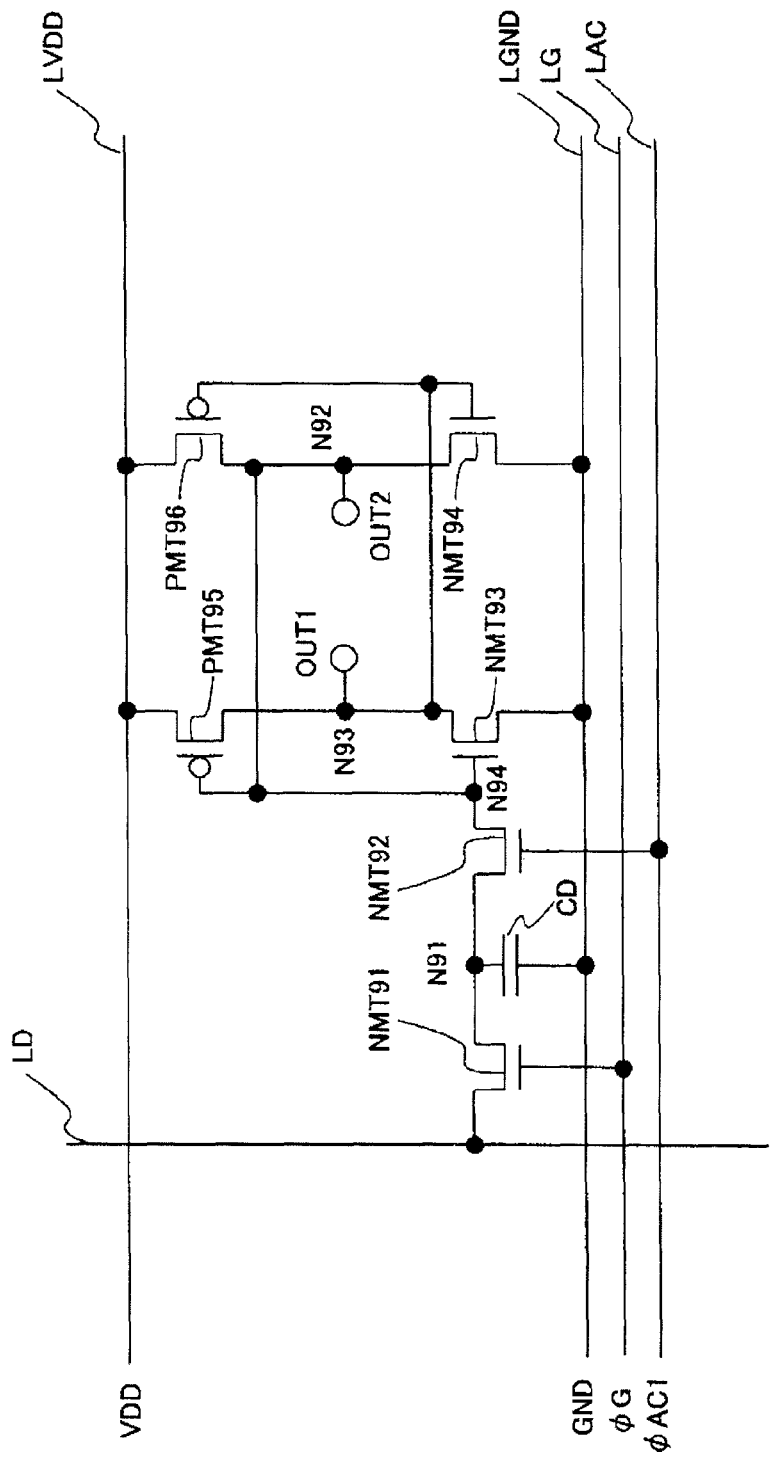
FIG. 12 is a circuit diagram which shows the structure of a latch circuit formed from a conventional CMOS circuit.
Figure 13:
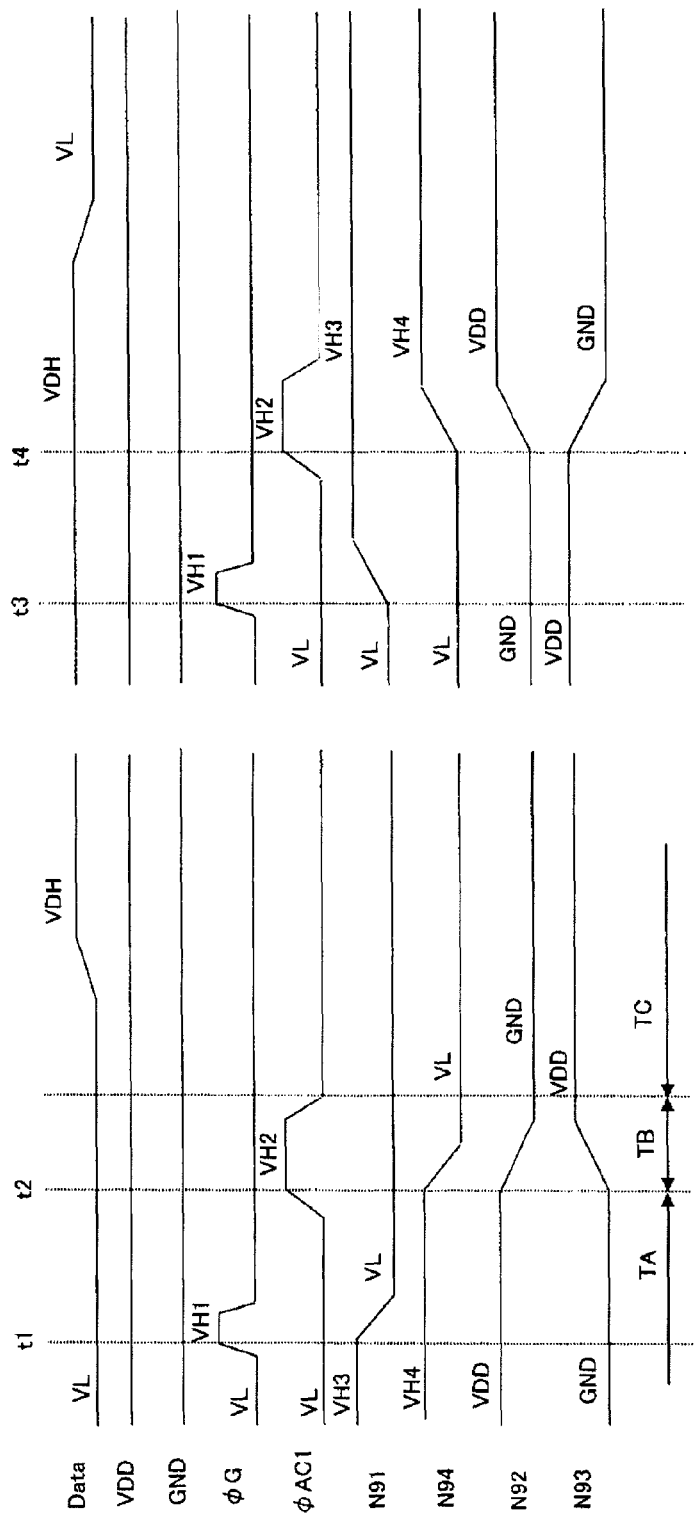
FIG. 13 is a timing chart which shows variation in accordance with time elapse of a scanning pulse (φG), a latch control signal (φL) and voltage of each node (N1, N2, N3, N4) of the latch circuit shown in FIG. 9.
Figure 14:
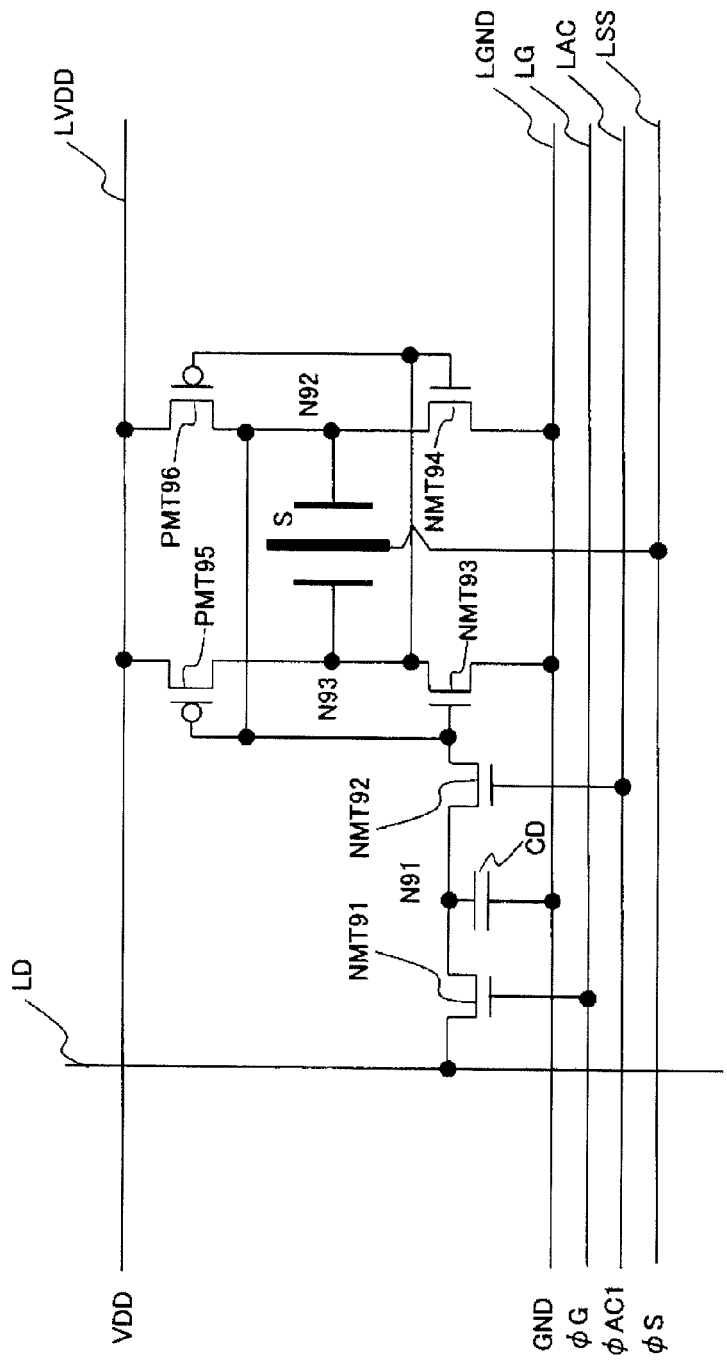
FIG. 14 is a circuit diagram which shows a circuit structure of a pixel circuit of a display which electrically controls the position of a movable shutter (s) to display an image.

Similar to FIG. 11, FIG. 3 is a circuit diagram which shows an example of a specific circuit structure in case a latch circuit of the present embodiment is applied to a pixel circuit of a display (referred to as a movable shutter type display below) in which the position of a movable shutters are electrically controlled to display an image. In addition, FIG. 4 is a block diagram which shows an approximate structure of a display applied with the latch circuit of the present embodiment, which electrically controls a position of a movable shutter(s to display an image. Furthermore, in FIG. 4, SSC is a control signal generation circuit, LSS is a movable shutter control line supplied with a shutter control signal (φS). In the movable shutter type display shown in FIG. 4, a plurality of pixel circuits shown in FIG. 3 each corresponding to 1 pixel (PX) are arranged in 2 dimensions. Here, the scanning line (LG) is arranged on each row of which signal is input to a vertical drive circuit (XDR). In addition, a signal line (LD) is arranged on each column of which signal is input to a horizontal drive circuit (YDR). The control signal generation circuit (SSC) generates the capacitance control signal (φW), the first latch control signal (φAC1), the second latch control signal (φAC2) and the shutter control signal (φS), which are supplied to the capacitance control line (LW), the first latch control line (LAC1), the second latch control lone (LAC2) and the movable shutter control line (LSS), respectively.

In the movable shutter type display which uses the pixel circuit shown in FIG. 3, a color image is display according to a field sequential method. That is, a 1/60 Hz frame is divided into red (R), green (G) and blue (B) frames, each of the color frames is divided into 6 or more sub-frames and an image of each gradation is displayed according to the length of a light emitting time period.

In the present embodiment, H level voltage and L level voltage in a differential output state are dynamically stored, which is different from a CMOS latch circuit. By long-time or endless usage thereof, a dynamically stored charge leaks due to an OFF current of a MOS transistor etc. and an output may become unstable because of voltage variation. However, in the movable shutter type display which uses thee pixel circuit shown in FIG. 3, it is possible to design and practically use a voltage and storage time period, because resetting of state is occurred cyclically (with an extremely short cycle period) (if the same state is kept, it is referred as resetting).

In the movable shutter type display which uses the pixel circuit shown in FIG. 3, data is programmed for every pixel on each row within a programming time period (TA in FIG. 2), and in a movable shutter state setting time period (TB in FIG. 2), the movable shutter (s) is made to move to the node N2 or the node N3 and an image is displayed in a display time period (TC in FIG. 2).

In this way, according to the present embodiment, it is possible to provide a latch circuit which can control a drain avalanche effect and improve reliability, and a display device which uses this latch circuit.

Second Embodiment

Figure 5:
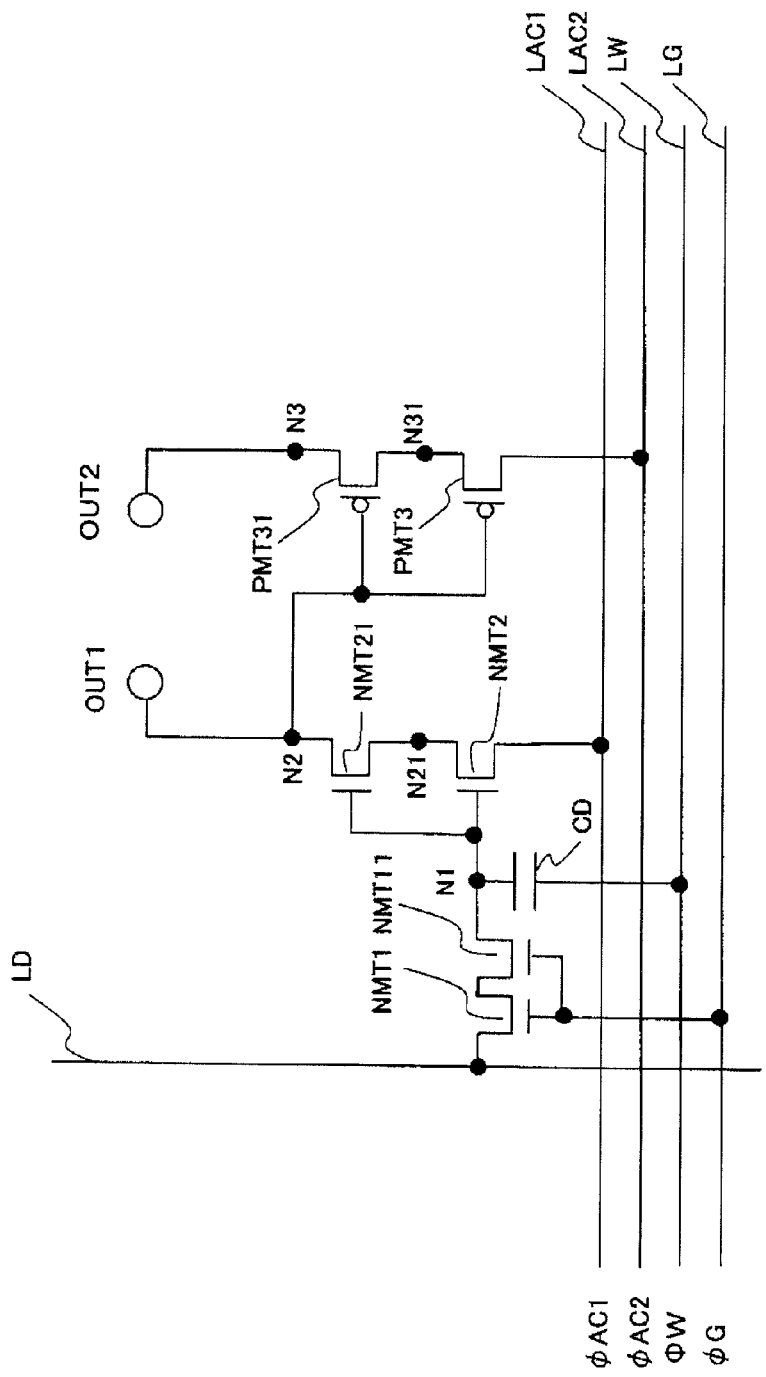
FIG. 5 is a diagram which shows a circuit structure of a latch circuit according to a second embodiment of the present invention.

FIG. 5 is a circuit diagram which shows a circuit structure of a latch circuit according to the second embodiment of the present invention. In the latch circuit shown in FIG. 5, n type MOS transistors (NMT1, NMT2) for processing a high voltage and a p type MOS transistor PMT3 of the latch circuit shown in FIG. 1 are respectively replaced with double gate transistors, which improves source drain resistance. That is, in the present embodiment, the n type MOS transistor NMT1 which comprises the latch circuit shown in FIG. 1 is replaced with an n type MOS transistor NMT1 and an n type MOS transistor NMT11. In addition, the n type MOS transistor NMT2 which comprises the latch circuit in FIG. 1 is replaced with an n type MOS transistor NMT2 and an n type MOS transistor NMT21 in the present embodiment. That is, the latch circuit shown in FIG. 5 is that in which each of the transistors NMT1 and NMT2 shown in FIG. 1 are respectively replaced with a combination of two transistors which are input with the same gate voltage, that is, double gate transistors. Similarly, the latch circuit of the present embodiment includes a p type MOS transistor PMT3 and a p type MOS transistor PMT31 which replaces the p type MOS transistor PMT3 of the latch circuit shown in FIG. 1. That is, the latch circuit of the present embodiment is that in which the transistor PMT3 shown in FIG. 1 is replaced with a combination of two transistors supplied with the same voltage, that is, double gate transistors. In this way, by adopting a double gate transistor structure, the latch circuit of the second embodiment has increased effective source drain resistance to process high voltage.

Third Embodiment

Figure 6:
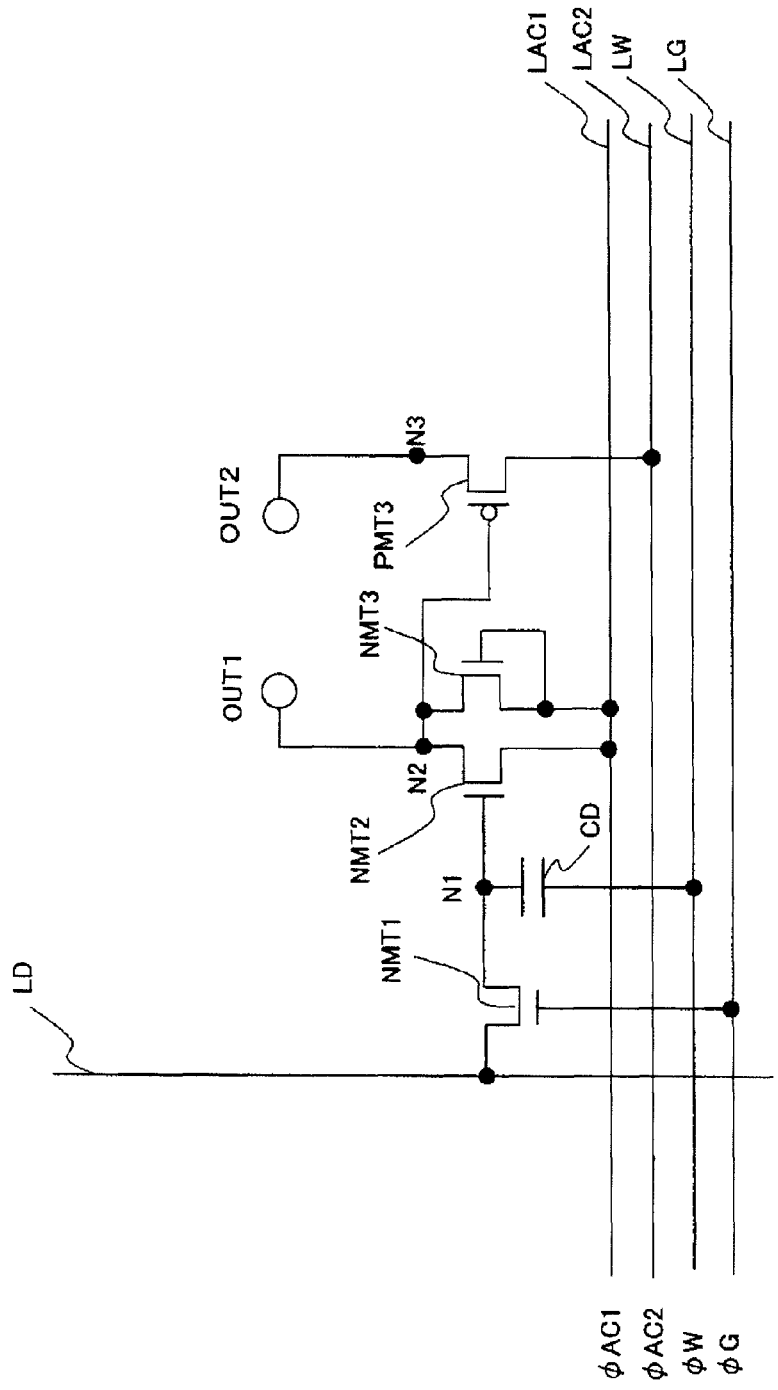
FIG. 6 is a diagram which shows a circuit structure of a latch circuit according to a third embodiment of the present invention.

FIG. 6 is a circuit diagram which shows a circuit structure of a latch circuit according to a third embodiment of the present invention. The latch circuit of the third embodiment is different to the latch circuit of the first embodiment shown in the FIG. 1 in the points that a diode-connected n type MOS transistor NMT3 is connected between a source and drain of the n type MOS transistor NMT2, and that a fixed voltage VL is supplied to the capacitance control line (LW). Furthermore, the n type MOS transistors (NMT1, NMT2, NMT3) and the p type MOS transistor PMT3 are MOS transistors having a semiconductor layer formed from polycrystalline silicon.

Figure 7:
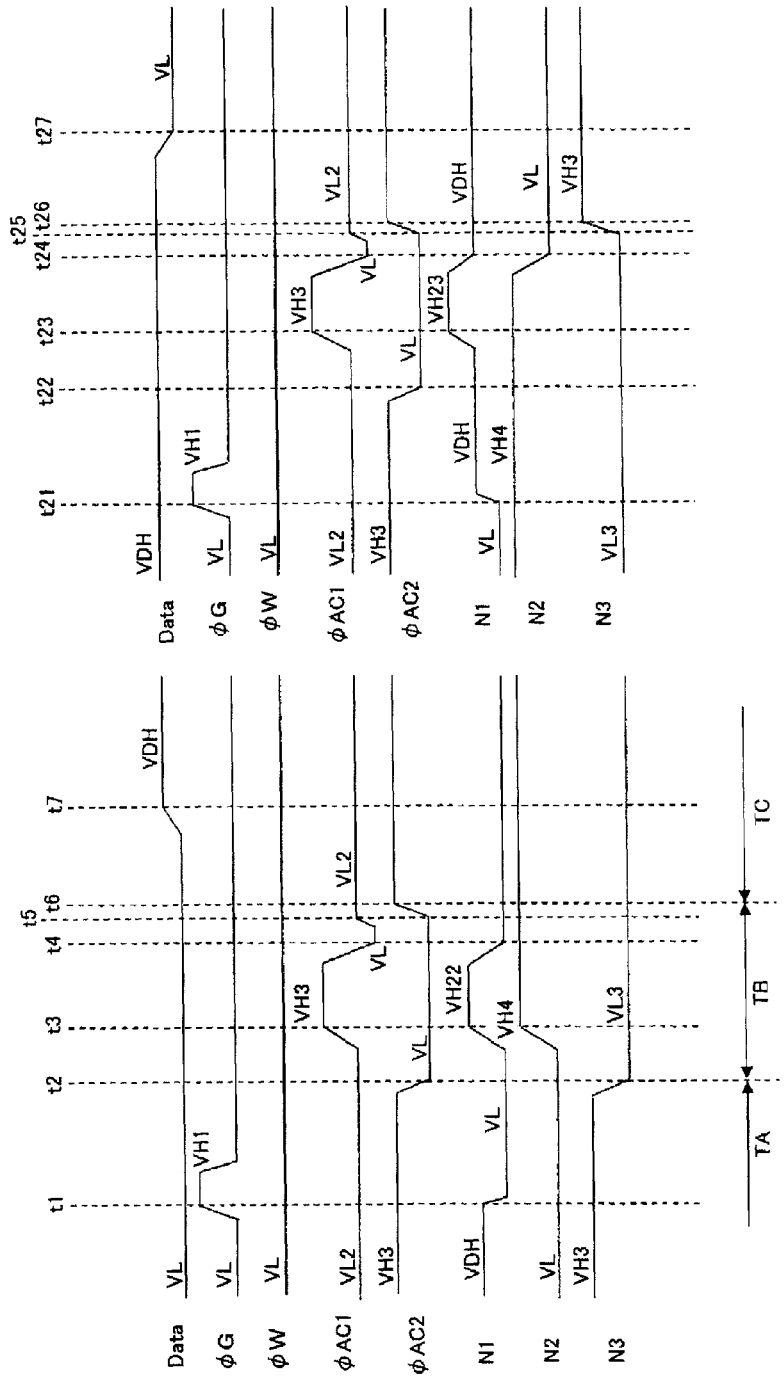
FIG. 7 is a timing chart which shows variation in accordance with time elapse of a scanning pulse (φG), a latch control signal (φAC1, φAC2) and voltage of each node (N1, N2, N3) of the latch circuit shown in FIG. 6.

FIG. 7 is a timing chart which shows variation in accordance with time elapse of a scanning pulse (φG), a latch control signal (φAC1, φAC2) and voltage of each node (N1, N2, N3) of the latch circuit shown in FIG. 6. First, the case where a voltage (data) on a signal line (LD) is an L level voltage is explained. Here, the voltage of the node N1 is an H level voltage VDH, that of the node N2 is an L Level voltage VL and that of the node N3 is an H level voltage VH3, before a time t1.

As is shown in FIG. 7, when a scanning pulse (φG) (that is, a signal reading pulse (gate pulse)) on a scanning line (LG) is changed from a L level voltage VL to a H level voltage VH1 (in other words, when a selection scanning voltage is input), the n type MOS transistor (input transistor NMT1) is turned ON and the voltage of the node N1 becomes a voltage (data, here, a voltage VL) on the signal line (LD). At this time, the voltage of the first latch control signal (φAC1) on the first latch control line (LAC1) becomes a voltage VL2 which is an intermediate voltage level, VL2 is set so that that the formula (4) below is satisfied, and the n MOS transistor NMT2 is maintained in an OFF state regardless of whether the voltage of the node N1 is a H level voltage VDH or a L level voltage VL.

$$VL2 \geq VHD + Vth \text{ (Vth is a threshold voltage of the transistor (NMT2))} \quad (4)$$

A second latch control signal (φAC2) on a second latch control line (LAC2) changes from an H level voltage VH3 to an L level voltage VL at a time t2. Here, whether the p type MOS transistor PMT3 is ON or OFF is determined by the voltage of the node N2. However, because the node N2 is an L level voltage VL at a time t2, the p type MOS transistor PMT3 is in an ON state and the voltage of the node N3 and the second latch control signal (φAC2) become an L level voltage VL3. Here, VL3 follows the following formula:

$$VL3 = VL - (-Vth) = VL + Vth$$

The first latch control signal (φAC1) on the first latch control line (LAC1) changes from an intermediate voltage level voltage VL2 to an H level voltage VH3 at a time t3. In this way, because the diode-connected n type MOS transistor NMT3 is in a conducting state, the voltage of the node N2 rises to an H level voltage VH4 with a rise in the voltage of the first latch control signal (φAC1). Here, VH4 is generally a voltage shown in the following formula:

$$VH4 \approx VH22 - Vth$$

The first latch control signal (φAC1) on the first latch control line (LAC1) changes from an H level voltage VH3 to an L level voltage VL at a time t4. However, because the n type MOS transistor NMT2 is maintained in an OFF state, the node N2 is maintained at an H level voltage VH4.

The first latch control signal (φAC1) on the first latch control line (LAC1) changes from an L level voltage VL to an intermediate voltage level voltage VL2 at a time t5. In this way, the n type MOS transistor NMT2 is maintained in an OFF state regardless of a programming voltage (VDH, VL) from the signal line (LD) to the node N1. The second control latch signal (φAC2) on the second latch control line (LAC2) changes from an L level voltage VL to an H level voltage VH3 at a time t6. Because a gate voltage of the p type MOS transistor PMT3 is a voltage of the node N2 and the voltage of the node N2 is an H level voltage VH4 at a time t6, the p type MOS transistor PMT3 is in an OFF state. Therefore, the node N3 is maintained at an L level voltage VL3. By following the procedure described above, a voltage of an output terminal (OUT1) becomes a H level voltage (=a voltage of the node N2) and a voltage of an output terminal (OUT2) becomes a L level voltage (=a voltage of the node N3) according to a signal voltage (a voltage corresponding to "0" data) programmed at a time t1, so that a differential output state between the output terminal (OUT1) and the output terminal (OUT2) is latched.

Next, the case where a voltage (data) on a signal line (LD) is an H level voltage VDH is explained. Here, before a time t2, the voltage of the node N1 is an L level voltage VL, that of the node N2 is an H level voltage VH4 and that of the node N3 is an L level voltage VL3.

As is shown in FIG. 7, when a scanning pulse (φG) (that is, a signal reading pulse (gate pulse)) on a scanning line (LG) is changed from a L level voltage VL to a H level voltage VH1 (in other words, when a selection scanning voltage is input), the input transistor NMT1 is turned ON and the voltage of the node N1 becomes a voltage (data, here, a voltage VDH) on the signal line (LD). At this time, the voltage of the first latch control signal (φAC1) on the first latch control line (LAC1) becomes a voltage VL2 which is an intermediate voltage level, and as described above, the n type MOS transistor NMT2 is maintained in an OFF state regardless of whether the voltage of the node N1 is a H level voltage VDH or a L level voltage VL, so that there is no variation in the output (latch state). The second latch control signal (φAC2) on the second latch control line (LAC2) becomes an L level voltage VL at a time t22. However, because the p type MOS transistor PMT3 is in an OFF state and the voltage (=voltage of the node N3) of the output terminal (OUT1) is an L level voltage VL3 before a time t22, there is no change in the voltage of the output terminal (OUT2).

The first latch control signal (φAC1) on the first latch control line (LAC1) changes from an intermediate voltage level voltage VL2 to an H level voltage VH3 at a time t23. In this way, because the diode connected n type MOS transistor NMT3 is in a conducting state, the voltage of the node N2 rises. However, because the voltage of the node N2 is already an H level voltage VH4, the voltage of the node N2 does not change. In addition, the p type MOS transistor PMT3 is maintained in an OFF state. When the first latch control signal (φAC1) of the first latch control line (LAC1) becomes a L level voltage VVL at a time t24, the n type MOS transistor NMT2 becomes an ON state and the voltage of the node N2 becomes a L level voltage VL. Together with this, the p type MOS transistor PMT3 becomes an ON state.

The first control latch signal (φAC1) on the first latch control line (LAC1) changes from an L level voltage VL to an intermediate voltage level voltage VL2 at a time t25. In this way, the n type MOS transistor NMT2 is maintained in an OFF state regardless of a programming voltage (VDH, VL) from the signal line (LD) to the node N1. In addition, because a gate voltage of the p type MOS transistor PMT3 is a voltage of the node N2 and the voltage of the node N2 is a L level voltage VL at a time t25, the p type MOS transistor PMT3 is maintained in an ON state. The second latch control signal (φAC2) on the second latch control line (LAC2) changes from an L level voltage VL to an H level voltage VH3 at a time t26. At this time, because the p type MOS transistor PMT3 is in an ON state, the voltage of the node N3 rises to an H level voltage VH together with a rise in the second latch control signal (φAC2).

By following the procedure described above, a voltage of an output terminal (OUT1) becomes an L level voltage (=a voltage of the node N2) while a voltage of an output terminal (OUT2) becomes an H level voltage (=a voltage of the node N3) according to a signal voltage (a voltage corresponding to "1" data) programmed at a time t21. In this way, a differential output state between the output terminal (OUT1) and the output terminal (OUT2) is latched. The following effects which are similar to the first embodiment can be obtained from the latch circuit of the present embodiment. Similar to the first and second embodiments, it is possible to apply the latch circuit of the present embodiment to the pixel circuit of the display (called a movable shutter type display) which electrically controls the position of a shutters to display an image. Furthermore, in the present embodiment, because the shutter control signal (φS) on the movable shutter control line (LSS) is generally a GND voltage (or a voltage VDD), the other end of the storage capacitance (CD) may also be connected to the movable shutter control line (LSS).

Fourth Embodiment

Figure 8:
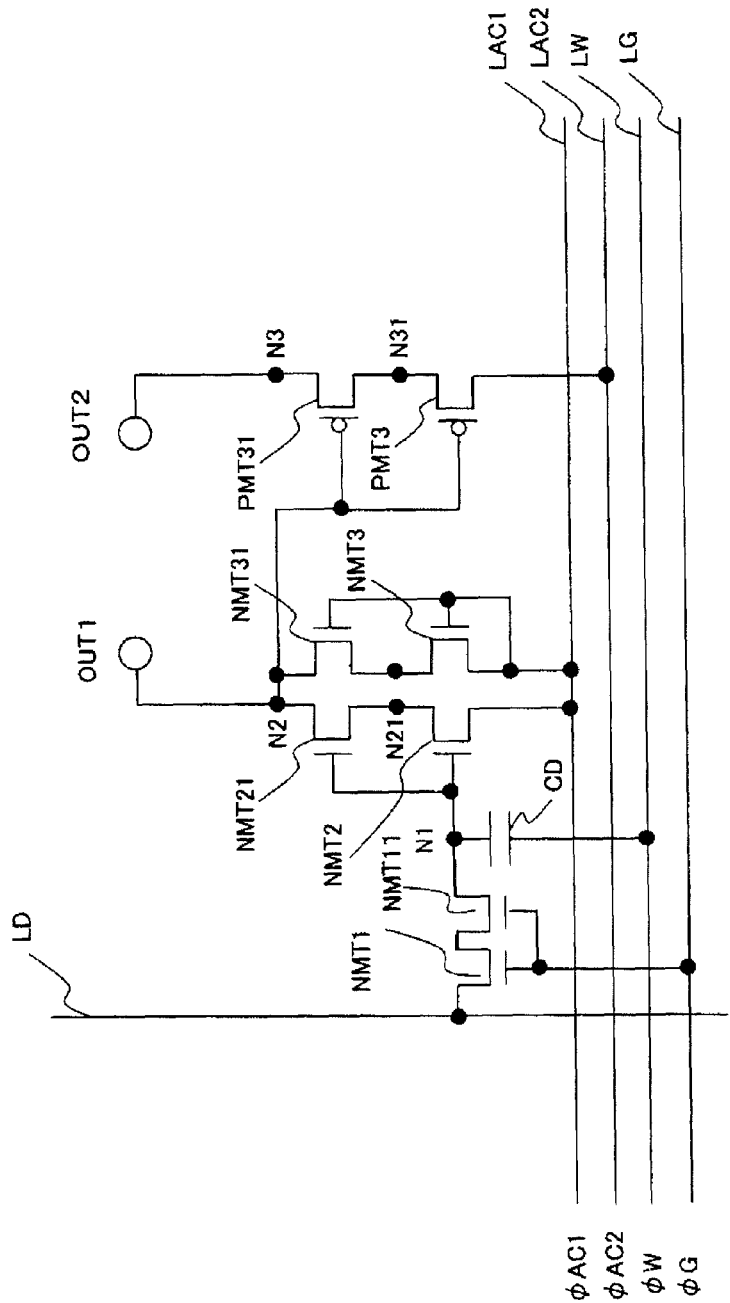
FIG. 8 is a diagram which shows a circuit structure of a latch circuit according to a fourth embodiment of the present invention.

FIG. 8 is a circuit diagram which shows a circuit structure of a latch circuit according to the fourth embodiment of the present invention. In the latch circuit shown in FIG. 8, n type MOS transistors (NMT1, NMT2, NMT3) for processing a high voltage and a p type MOS transistor PMT3 of the latch circuit shown in FIG. 6 are respectively replaced with a double gate transistors, which improves source drain resistance. That is, in the latch circuit of the fourth embodiment, the n type MOS transistor NMT1 shown in FIG. 6 is replaced with an n type MOS transistor NMT1 and an n type MOS transistor NMT11, which means that the transistor NMT1 shown in FIG. 6 is replaced with a combination of two transistors which are input with the same gate voltage, that is, double gate transistors.

Figure 9:
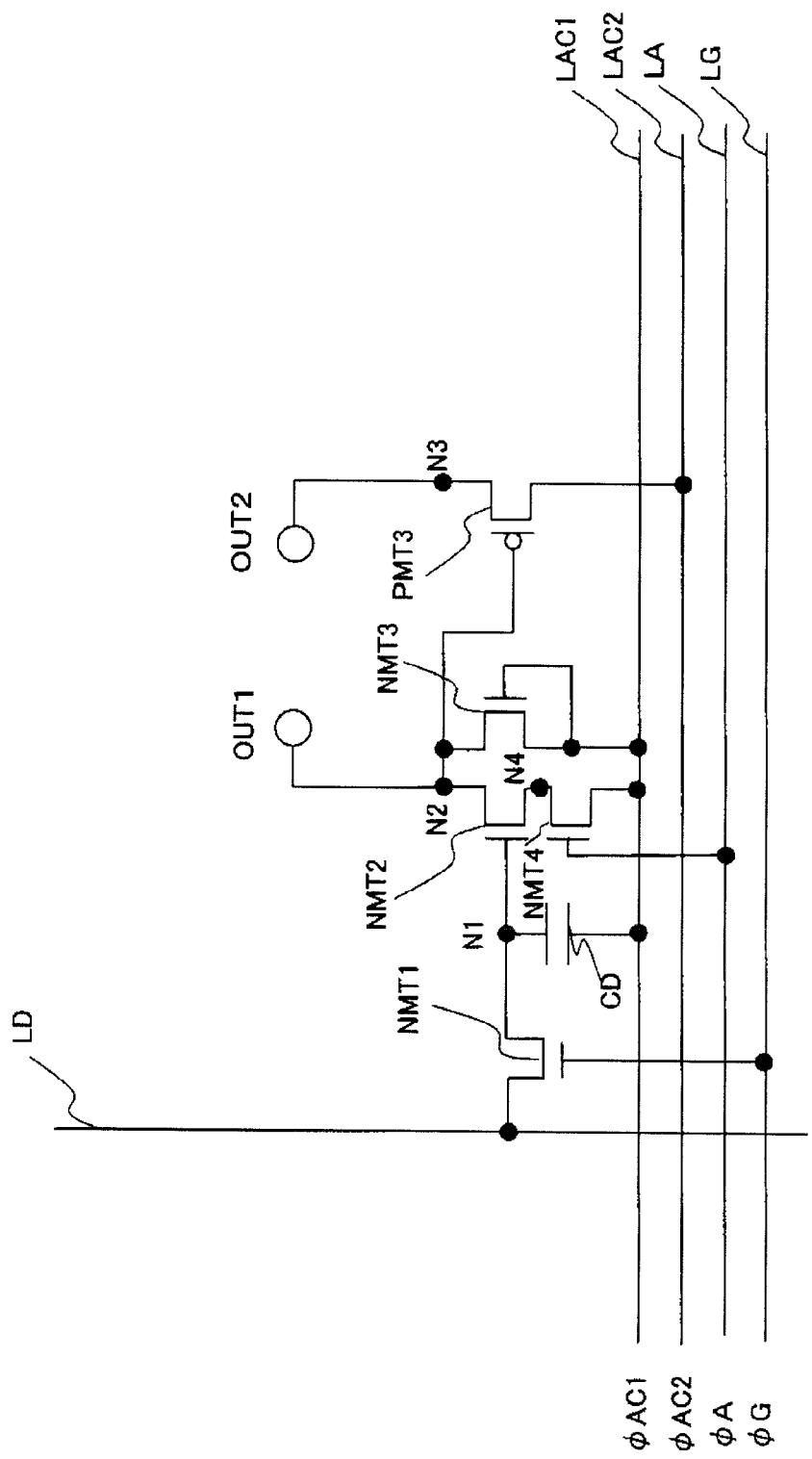
FIG. 9 is a diagram which shows a circuit structure of a latch circuit according to a fifth embodiment of the present invention.

Similarly, the latch circuit of the fourth embodiment includes a structure in which the n type MOS transistor NMT2 shown in FIG. 6 is replaced with an n type MOS transistor NMT2 and a an n type MOS transistor NMT21, which means that the transistor NMT2 is replaced with a combination of two transistors which are input with the same voltage, that is, double gate transistors. Similarly, the latch circuit of the fourth embodiment includes a structure in which the n type MOS transistor NMT3 shown in FIG. 6 is replaced with an n type MOS transistor NMT3 and a an n type MOS transistor NMT31, which means that the transistor NMT3 is replaced with a combination of two transistors which are input with the same voltage, that is double gate transistors. Similarly, the latch circuit of the fourth embodiment includes a structure in which the p type MOS transistor PMT3 shown in FIG. 6 is replaced with a p type MOS transistor PMT3 and a p type MOS transistor PMT31, which means that the transistor PMT3 shown in FIG. 6 is replaced with a combination of two transistors respectively supplied with the same voltage, that is, double gate transistors. In this way, by adopting a double gate transistor structure, the latch circuit of the fourth embodiment has increased effective source drain resistance to process high voltage Fifth Embodiment FIG. 9 is a circuit diagram which shows a circuit structure of a latch circuit according to a fifth embodiment of the present invention. The latch circuit of the present embodiment is different to the latch circuit of the second embodiment in the points that an type MOS transistor NMT4 is connected between the drain of the n type MOS transistor NMT2 and the first latch control line (LAC1), that the gate of the n type MOS transistor NMT4 is connected to a third latch control line (LA) and that one end of the storage capacitance (CD) is connected to the first latch control line (LAC1). Furthermore, the n type MOS transistors (NMT1, NMT2, NMT3, NMT4) and the p type MOS transistor PMT3 are MOS transistors having a semiconductor layer formed from polycrystalline silicon.

Figure 10:
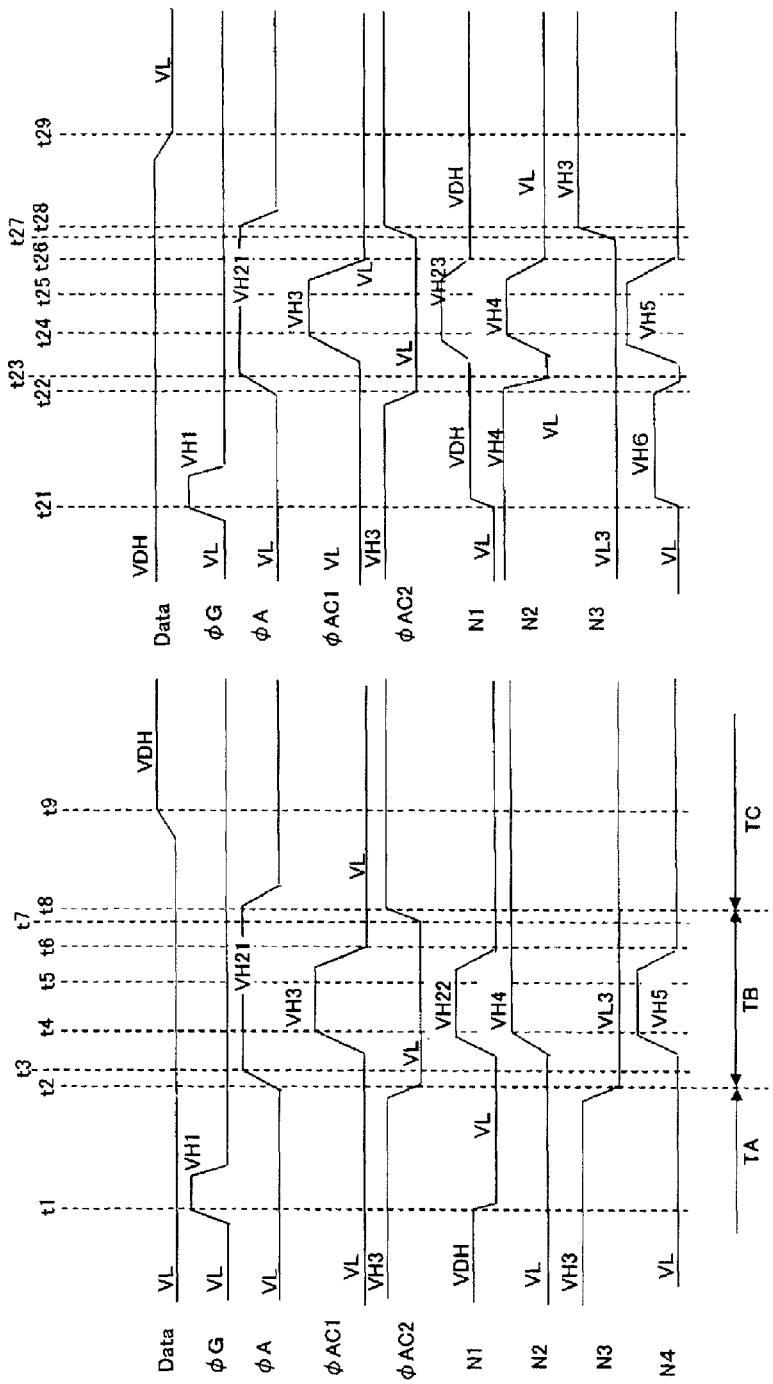
FIG. 10 is a timing chart which shows a scanning pulse (φG), a latch control signal (φAC1, φAC2, φA) and a change over time of each node (N1, N2, N3, N4) of the latch circuit shown in FIG. 9.

FIG. 10 is a timing chart which shows variation in accordance with time elapse of a scanning pulse (φG), a latch control signal (φAC1, φAC2, φA) and voltage of each node (N1, N2, N3, N4) of the latch circuit shown in FIG. 9. First, the case where a voltage (data) on a signal line (LD) is an L level voltage is explained. Here, the voltage of the node N1 is an H level voltage VDH, that of the node N2 is an L Level voltage VL and that of the node N3 is an H level voltage VH3, before a time t1. As is shown in FIG. 10, when a scanning pulse (φG) (that is, a signal reading pulse (gate pulse)) on a scanning line (LG) is changed from a L level voltage VL to a H level voltage VH1 (in other words, when a selection scanning voltage is input), the n type MOS transistor (input transistor NMT1) is turned ON and the voltage of the node N1 becomes a voltage (data, here, a voltage VL) on the signal line (LD).

A second latch control signal (φAC2) on a second latch control line (LAC2) changes from an H level voltage VH3 to an L level voltage VL at a time t2. Here, whether the p type MOS transistor PMT3 is ON or OFF is determined by the voltage of the node N2. However, because the voltage of the node N2 is an L level voltage VL at a time t2, the p type MOS transistor PMT3 is in an ON state and the voltage of the node N3 and the second latch control signal (φAC2) become an L level voltage VL3. Here, VL3 follows the following formula:

$$VL3=VL-(-Vth)=VL+Vth$$

A voltage of the third latch control line (LA) changes from VL to VH21. In this way, because the n type MOS transistor NMT2 is in an OFF state, there is no change in the node N2. The first latch control signal (φAC1) on a first latch control line (LAC1) changes from an L level voltage VL to an H level voltage VH3 at a time t4. Because the diode connected n type MOS transistor NMT3 is in a conducting state, the voltage of the node N2 becomes an H level voltage VH4. Because one end of the storage capacitance (CD) is connected to the first latch control signal (φAC1), the voltage of the node N1 becomes VH2. Here, VH22 follows the following formula:

$$VH22=VL+VH3(CD/(CD+CS)$$

In addition, the voltage of the node (N4) becomes a voltage VH5, which is VH22−Vth or VH21−Vth whichever is higher.

The first control signal (φAC1) changes from an H level voltage VH3 to an L level voltage VL at a time t6. Together with this, the voltage of the node N1 which is capacitively coupled by the storage capacitance (CD) returns to a voltage VL. Therefore, because the n type MOS transistor NMT2 is in an OFF state, the node N2 is maintained at an H level voltage VH4. At this time, because the n type MOS transistor NMT4 is in an ON state, the node N4 returns to a voltage VL. The second latch control signal (φAC2) changes from an L level voltage VL to an H level voltage VH3 at a time t8. Because the gate voltage of the p type MOS transistor PMT3 is a voltage of the node N2 and the voltage of the node N2 is a H level voltage VH4 at a time t8, the p type MOS transistor in in an OFF state, Therefore, the node N3 is maintained at a L level voltage VL3.

The third latch control signal (φA) changes to an L level voltage VL just after a time t8 and the n type MOS transistor NMT4 becomes in an OFF state. That is, during a period until the third latch control signal (φA) changes to an H level voltage next, even if a voltage of the node N1 changes due to input of a signal, there is no change in the voltage of the node N2 and the node N3. Strictly speaking, when the node N1 changes from an L level to an H level due to a signal being input, the n type MOS transistor NMT2 changes from an OFF state to an ON state and the voltage of the node N4 changes from VL to VHD−Vth. Because an electrical charge Q which is required for the changes of voltage at the node N4 is supplied from the node N2, the voltage of the node N2 drops. However, since it is sufficient to either set the capacitance of the node N2 and/or node N4 or adjust the first latch control signal (φAC1) so that this voltage drop of the node N2 does not affect the operation of the latch circuit, discussion here is omitted. By following the procedure described above, a voltage of an output terminal (OUT1) becomes a H level voltage (=a voltage of the node N2) and a voltage of an output terminal (OUT2) becomes a L level voltage (=a voltage of the node N3) according to a signal voltage (a voltage corresponding to "0" data) programmed at a time t1, a differential output state between the output terminal (OUT1) and the output terminal (OUT2) is latched.

Next, the case where a voltage (data) on the signal line (LD) is an H level voltage VDH is explained. Here, before a time t2, the voltage of the node N1 is an L voltage VL, that of the node N2 is an H level voltage VH4 and that of the node N3 is an L level voltage VL3.

As is shown in FIG. 10, when a scanning pulse (φG) (that is, a signal reading pulse (gate pulse)) on a scanning line (LG) is changed from a L level voltage VL to a H level voltage VH1 (in other words, when a selection scanning voltage is input), the input transistor (NMT1) is turned ON and the voltage of the node N1 becomes a voltage (data, here, a voltage VDH) on the signal line (LD). At this time, the n type MOS transistor NMT2 is in an ON state. The n type MOS transistor NMT4 is maintained in an OFF state. In this way, node N4 becomes a voltage VH6 (=VDH−Vth).

The second latch control signal (φAC2) on a second latch control line (LAC2) changes to an L level voltage VL. However, because the p type MOS transistor PMT3 is in an OFF state and the voltage (=voltage of the node N3) of the output terminal (OUT2) is an L level voltage VL3 before a time t22, the voltage of the output terminal (OUT2) does not change. The third latch control signal (φAC3) on the third latch control line (LA) changes from an L level voltage VL to an H level voltage VH21 at a time t23. In this way, the n type MOS transistor NMT4 is in an ON state. At this time, because the n type MOS transistor NMT2 is in an ON state, the voltage of the node N2 and the node N4 become a voltage VL. In this way, the p type MOS transistor PMT3 becomes in an ON state, whereas there is no change in the voltage of the output terminal (OUT2), because the voltage of the output terminal (OUT2) is already an L level voltage VL3. The first latch control signal (φAC1) on a first latch control line (LAC1) changes to an H level voltage VH3 at a time t24. At this time, the voltage of the node N2 becomes an H level VH4 via the diode-connected n type MOS transistor NMT3. At the same time, the voltage of the node N4 becomes a voltage VH5 and the voltage of the node N1 becomes VH3.

The first latch control signal (φAC1) on a first latch control line (LAC1) changes from an H level voltage VH3 to an L level voltage VL at a time t26. Together with this, the voltage of the node N1 returns to VHD. On the contrary, the voltages of the node N2 and the node N4 both become a L level voltage VL, because the n type MOS transistor NMT2 is in an ON state, the n type MOS transistor NMT4 is in an ON state, and the node N2 is connected to the first latch control line (LAC1) via the n type MOS transistor (NMT2, NMT4). At this time, the p type MOS transistor PMT3 becomes in an ON state at a time t27, because the gate voltage of the p type MOS transistor PMT3 is a voltage of the node N2 and the voltage of the node N2 is a L level voltage VL. The second latch control signal (φAC2) on a second latch control line (LAC2) changes from an L level voltage VL to an H level voltage VH3 at a time t28. At this time, because the p type MOS transistor PMT3 is in an ON state, the voltage of the node N3 rises to an H level voltage VH3 together with a rise of the second latch control signal (φAC2).

By following the procedure described above, a voltage of an output terminal (OUT1) becomes a H level voltage (=a voltage of the node N2), and a voltage of an output terminal (OUT2) becomes a L level voltage (=a voltage of the node N3) according to a signal voltage (a voltage corresponding to "1" data) programmed at a time t21, so that a differential output state between the output terminal (OUT1) and the output terminal (OUT2) is latched. The following effects which are similar to the first embodiment can be obtained from the latch circuit of the present embodiment. Similar to the first and second embodiments, it is possible to apply the latch circuit of the present embodiment to the pixel circuit of the display (called a movable shutter type display) which electrically controls the position of shutters to display an image. Furthermore, in the present embodiment, because the shutter control signal (φ5) on the movable shutter control line (LSS) is generally a GND voltage (or a voltage VDD), the other end of the storage capacitance (CD) may also be connected to the movable shutter control line (LSS).

Sixes Embodiment

FIG. 11 is a circuit diagram which shows a circuit structure of a latch circuit according to the sixth embodiment of the present invention. In the latch circuit shown in FIG. 11, n type MOS transistors (NMT1, NMT2, NMT3) for processing a high voltage and a p type MOS transistor PMT3 of the latch circuit shown in FIG. 9 are respectively replaced with a double gate transistors, which improves source drain resistance. That is, in the latch circuit of the sixth embodiment, the n type MOS transistor NMT1 shown in FIG. 9 is replaced with an n type MOS transistor NMT1 and an n type MOS transistor NMT11, which means that the n type MOS transistor NMT1 shown in FIG. 9 is replaced with a combination of two transistors which are input with the same gate voltage, that is, double gate transistors.

Similarly, in the latch circuit of the sixth embodiment, the n type MOS transistor NMT2 shown in FIG. 9 is replaced with an n type MOS transistor NMT2 and a an n type MOS transistor NMT21, which means that the n type MOS transistor NMT2 shown in FIG. 9 is replaced with a combination of two transistors which are input with the same voltage, that is, double gate transistors. Similarly, in the circuit structure of the latch circuit of the sixth embodiment, the n type MOS transistor NMT3 shown in FIG. 9 is replaced with an n type MOS transistor NMT3 and an n type MOS transistor NMT31, which means that the n type MOS transistor NMT3 shown in FIG. 9 is replaced with a combination of two transistors which are input with the same voltage, that is, double gate transistors.

Similarly, the latch circuit of the sixth embodiment includes a structure in which the p type MOS transistor PMT3 shown in FIG. 9 is replaced with a p type MOS transistor PMT3 and a p type MOS transistor PMT31, which means that the transistor PMT3 shown in FIG. 9 is replaced with a combination of two transistors supplied with the same voltage, that is double gate transistors. In this way, by adopting a double gate transistor structure, the latch circuit of the sixth embodiment has increased effective source drain resistance and reduced high voltage. Furthermore, because the n type MOS transistor NMT4 is not essentially applied with a VDH−Vth voltage or more, the transistor remains as a single gate transistor. However, the n type MOS transistor NMT4 may be replaced provided with double gate transistors.

Furthermore, in the explanation provided above, examples are given where n type polycrystalline silicon thin film transistors are used for the first transistor NMT1, the third transistor NMT2, the fourth transistor NMT3 and the fifth transistor NMT4 and a p type polycrystalline silicon thin film transistor is used for the second transistor PMT3. However, it is also possible to use a p type polycrystalline silicon thin film transistor for the first transistor NMT1, the third transistor NMT2, the fourth transistor NMT3 and the fifth transistor NMT4. In addition, it is also possible to use an n type polycrystalline silicon thin film transistor for the second transistor PMT3. Furthermore, in the case where p type polycrystalline silicon thin film transistors are used for the first transistor NMT1, the third transistor NMT2, the fourth transistor NMT3 and the fifth transistor NMT4 and an n type polycrystalline silicon thin film transistor is used for the second transistor PMT3, it would be obvious to a person skilled in the art that it is necessary to reverse the polarity of the voltage relationship applied to these transistors. Furthermore, it is also possible to use amorphous silicon thin film transistors for the first and second transistors. The amorphous silicon thin film transistors can be manufactured at a lower process cost since crystallization is not necessary. In addition, in the explanation provided above, the case where the latch circuit of the present invention is applied to a pixel circuit of a movable type shutter display was explained. However, the present invention can also be applied to other displays which require the same operations other than a pixel circuit of a movable shutter type display.

The invention carried out by the inventors is explained in detail above based on the embodiments. However, the present invention is not limited by these embodiments and various modifications can be made without departing from the scope of the invention.

What is claimed is:

1. A latch circuit for holding and latching data when a scanning voltage is input, the circuit comprising:
    an input transistor having first and second electrodes and a gate, the first electrode being applied with a voltage corresponding to "0" or "1", the input transistor outputting the voltage from the second electrode when the scanning voltage is input to the gate;
    a retention capacitance retaining a voltage output by the input transistor, and having a first electrode and a second electrode, the second electrode being applied with a capacitance control signal and the first electrode being connected to the second electrode of the input transistor;

a first transistor which is one of n type and p type transistors having a gate connected to the second electrode of the input transistor, a first electrode applied with a first latch control signal and a second electrode connected to a first output terminal; and a second transistor which is the other of n type and p type transistors having a gate connected to the second electrode of the first transistor, a first electrode input with a second latch control signal and a second electrode connected to a second output terminal;

wherein voltage levels of the capacitance control signal the first latch control signal and the second latch control signal are respectively changed at a certain timing, so that a voltage of the first output terminal and a voltage of the second output terminal are changed to a voltage corresponding to "0" or "1" and latched.

2. The latch circuit according to claim 1, wherein, on an assumption that time elapses in a sequence from a time t1 to a time t6, the voltage of the second latch control signal is a second voltage level in a time period up to a time t1 after a voltage corresponding to "0" data or "1" data is retained in the retention capacitance, changed to a first voltage level from the second voltage level at the time t1, and changed to the second voltage level from the first voltage level at a time t7;

the voltage of the capacitance control signal is the second voltage level in a time period up to a time t2, changed to the second voltage level from the first voltage level at the time t2, and changed to the first voltage level from the second voltage level at a time t4; and the voltage of the first latch control signal is an intermediate voltage level between the first voltage level and the second voltage level in a time period up to a time t3, changed to the second voltage level from the intermediate voltage level at the time t3, changed to the first voltage level from the second voltage level at a time t5, and changed to the intermediate voltage level from the first voltage level at a time t6.

3. The latch circuit according to claim 2, wherein the first transistor is turned OFF before the time t3, is turned ON at the time t3, is turned off at the time t4, is turned ON or OFF at the time t5 in accordance with the voltage retained in the retention capacitance, and turned OFF at the time t6;

wherein the second transistor is turned ON by the first transistor being turned ON at the time t3, turned OFF at the time t4, turned ON when the first transistor is turned ON at the time t5, and turned OFF when the first transistor is turned OFF at the time t5;

wherein a voltage of the first output terminal is changed to the intermediate voltage level at the time t3 with the first transistor turned ON, changed to the second voltage level at the time t4, and maintained after being changed to the first voltage level in the case where the first transistor is switched ON at the time t5, or maintained to the second voltage level in the case where the first transistor is switched OFF at the time t5; and wherein a voltage of the second output terminal is changed to the first voltage level at the time t3 with the second transistor turned ON, and maintained at the second voltage after being changed to the second voltage level at the time t7 in the case where the first transistor is switched ON at the time t5, or maintained in the case where the first transistor is switched OFF at the time t5.

4. The latch circuit according to claim 2, wherein the first transistor is an n type transistor, the second transistor is a p type transistor, and the second voltage level is a voltage level of a higher potential than the first voltage level.

5. The latch circuit according to claim 1, wherein each transistor has a semiconductor layer formed from a polycrystalline silicon film.

6. A display device comprising the latch circuit according to claim 1, wherein each of the input transistor, the first transistor and the second transist have a semiconductor layer formed from a polycrystalline silicon film.

7. A display device including a plurality of pixels, each pixel having a movable shutter, and a position of the movable shutter being electrically controlled to display an image, wherein each pixel includes a pixel circuit electrically controlling a position of the movable shutter and the pixel circuit includes a latch circuit for holding and latching data when a scanning voltage is input, the circuit including:

an input transistor having first and second electrodes and a gate, the first electrode being applied with a voltage corresponding to "0" or "1", the input transistor outputting the voltage from the second electrode when the scanning voltage is input to the gate;

a retention capacitance retaining a voltage output by the input transistor, and having a first electrode and a second electrode, the second electrode being applied with a capacitance control signal and the first electrode being connected to the second electrode of the input transistor;

a first transistor which is one of n type and p type transistors having a gate connected to the second electrode of the input transistor, a first electrode applied with a first latch control signal and a second electrode connected to a first output terminal; and a second transistor which is the other of n type and p type transistors having a gate connected to the second electrode of the first transistor, a first electrode input with a second latch control signal and a second electrode connected to a second output terminal;

wherein voltage levels of the capacitance control signal and the first latch control signal and the second latch control signal are respectively changed at a certain timing, so that a voltage of the first output terminal and a voltage of the second output terminal are changed to a voltage corresponding to "0" or "1" and latched.

* * * * *